(12) United States Patent
Bao et al.

(10) Patent No.: US 9,411,676 B2
(45) Date of Patent: Aug. 9, 2016

(54) METHOD AND DEVICE FOR TRANSMITTING DATA

(75) Inventors: Dong-shan Bao, Beijing (CN); Jiaqing Wang, Beijing (CN)

(73) Assignee: Beijing Nufront Mobile Multimedia Tech. Co., Ltd., Beijing (CN)

( * ) Notice: Subject to any disclaimer, the term of this patent is extended or adjusted under 35 U.S.C. 154(b) by 250 days.

(21) Appl. No.: 14/130,965

(22) PCT Filed: Mar. 16, 2012

(86) PCT No.: PCT/CN2012/072413
§ 371 (c)(1),
(2), (4) Date: Apr. 16, 2014

(87) PCT Pub. No.: WO2013/004090
PCT Pub. Date: Jan. 10, 2013

(65) Prior Publication Data
US 2014/0258806 A1 Sep. 11, 2014

(30) Foreign Application Priority Data

Jul. 6, 2011 (CN) .......................... 2011 1 0189200
Sep. 5, 2011 (CN) .......................... 2011 1 0260661
Feb. 14, 2012 (CN) .......................... 2012 1 0033174

(51) Int. Cl.
*H03M 13/00* (2006.01)
*G06F 11/10* (2006.01)
*H04L 1/00* (2006.01)
*H03M 13/11* (2006.01)
*H03M 13/03* (2006.01)

(52) U.S. Cl.
CPC ............. *G06F 11/10* (2013.01); *H03M 13/036* (2013.01); *H03M 13/116* (2013.01); *H03M 13/1177* (2013.01); *H03M 13/611* (2013.01); *H03M 13/616* (2013.01); *H03M 13/6505* (2013.01); *H03M 13/6552* (2013.01); *H04L 1/0043* (2013.01); *H04L 1/0057* (2013.01)

(58) Field of Classification Search
CPC ..... G06F 11/10; H04L 1/0043; H04L 1/0057; H03M 13/116; H03M 13/611; H03M 13/6505; H03M 13/936; H03M 13/6552; H03M 13/1177; H03M 13/616
See application file for complete search history.

(56) References Cited

U.S. PATENT DOCUMENTS

2012/0173949 A1* 7/2012 Liu ..................... H03M 13/116
714/752

FOREIGN PATENT DOCUMENTS

| CN | 1960188 A | 5/2007 | |
|---|---|---|---|
| CN | 101047391 A | 10/2007 | |
| CN | 102025441 A * | 4/2011 | ........ H03M 13/116 |
| EP | 2178213 A1 | 4/2010 | |

OTHER PUBLICATIONS

International Search Report issued in International Application No. PCT/CN2012/072413 on Jun. 28, 2012.

* cited by examiner

*Primary Examiner* — Sam Rizk
(74) *Attorney, Agent, or Firm* — Morgan, Lewis & Bockius LLP

(57) ABSTRACT

Disclosed is a method for data transmission, comprising: generating the parity check matrix on the basis of the generating sequence corresponded to the preserved row generator; encoding the input data by the generated matrix obtained by said parity check matrix, and obtaining the output data comprising the parity check information. Also provided in the present invention is an apparatus for data transmission. The method and apparatus of the present invention could make the parity check matrix take the minimum storage space.

19 Claims, 8 Drawing Sheets

METHOD AND DEVICE FOR TRANSMITTING DATA

CROSS-REFERENCE TO RELATED APPLICATION

This application claims the benefit of a Chinese patent application No. 201110189200.2 filed on Jul. 6, 2011 and titled "Method and apparatus for data transmission", which is incorporated herein by reference in its entirety.

This application claims the benefit of a Chinese patent application No. 201110260661.4 filed on Sep. 5, 2011 and titled "Method and apparatus for data transmission", which is incorporated herein by reference in its entirety.

This application claims the benefit of a Chinese patent application No. 201210033174.9 filed on Feb. 14, 2012 and titled "Method and apparatus for data transmission", which is incorporated herein by reference in its entirety.

FIELD OF THE INVENTION

The present invention relates to the communication technology, particularly relates to a method and apparatus for data transmission.

BACKGROUND OF THE INVENTION

Various errors occur in the data transmission of communication system by the influence of random noise or multipath fading in wireless transmission, etc. the channel coding could provide a reliable communication in the communication channel with noise. Currently, the low density parity check code (LDPC) has been considered as one of the best error correction coding methods for the excellent performance and efficient decoding algorithm.

LDPC code is a linear error correction code on the basis of sparse parity check matrix H, the elements in H is either 0 or 1. if N represents the length of LDPC code, K represents the length of information bits, M represents the length of check bits, $\gamma$ represents the row weight, $\lambda$ represents the column weight, R represents the code rate, that LDPC code could be expressed as (N,K) LDPC code. If $\gamma$ and $\lambda$ are constants, the LDPC code is regular LDPC code, otherwise, it is irregular LDPC code.

The codeword of LDPC code is the zero space of the check matrix H thereof, the encoding process is described as follows: first, constructing parity check matrix H by the parity check matrix constructing unit, on the basis of the preset LDPC encoding parameter; then, obtaining generating matrix G by the generating matrix constructing unit, on the basis of check matrix H, wherein, generating matrix G and the corresponding check matrix H are dual matrix; finally, encoding the input data s by generating matrix G and obtaining the output LDPC codeword c by the encoding unit.

From the practical point, one important reason of restricting the wide use of LDPC code is: the sparse parity check matrix and the non-sparse parity check matrix take too much storage space, which causes that the encoding of LDPC code need too much storage space. Besides, the exorbitant complexity of the traditional encoding process is another reason to limit the wide use of LDPC code. The LDPC code has not been widely used for the existence of the above drawbacks.

SUMMARY OF THE INVENTION

To solve the above technical problems, the present invention provides a method for data transmission, to reduce the storage space needed for storing the parity check matrix. A brief summarization is given below to provide a basic understanding of some aspects of the embodiments disclosed. This summarization part is not a general commentary, or to determine the key/important component elements or to describe the protection scope of these embodiments. The only object thereof is to present some concepts in a simple form, which act as a preamble of the subsequent detailed illustration.

The purpose of the present invention is to provide a method for data transmission, comprising:

Generating the parity check matrix on the basis of the generating sequence corresponded to the preserved row generator;

Encoding the input data by the generating matrix obtained by said parity check matrix, and obtaining the output data comprising the parity check information.

The present invention also provides an apparatus for data transmission, comprising: a storing module, a check matrix generating module and a codeword generating module;

Said storing module, used for storing the generating sequence corresponded to the row generator and providing said generating sequence to said check matrix generating module;

Said check matrix generating module, used for generating the parity check matrix on the basis of said generating sequence provided by said storing module, and transmitting said parity check matrix to said codeword generating module;

Said codeword generating module, used for receiving said parity check matrix from said check matrix generating module, and encoding the input data by the generating matrix obtained by said parity check matrix.

It could be got from the above schemes that, the method and apparatus for data transmission in the present invention, use the generating sequence corresponded to the row generator to represent the parity check matrix, and obtain the parity check matrix by cyclic shift or directly addressing of the row generator, and make the parity check matrix take the minimum storage space.

To attain the above and related objects, one or more embodiments include the features that will be illustrated in detail below and specifically designated in the claims. The following illustration and drawings illustrate some exemplary aspects in detail; moreover, it only indicates some of the various modes that may be utilized by the principle of each embodiment. Other benefits and novel features will be apparent from the following detailed illustration in conjunction with the drawings, and all the embodiments disclosed intend to contemplate all these aspects and their equivalents.

DETAILED DESCRIPTION OF THE INVENTION

The description below and accompanying drawings fully illustrate specific embodiments of the invention, to enable one skilled in the art to implement the embodiments. Modifications, such as structural, logical, electrical and process modifications, can be made in other embodiments. The embodiments only represent some possible variations. Individual components or functions are optional and the operation order is variable, unless it is otherwise stated specifically. A part of and a certain feature of some embodiments may be included in or replaced by a part of and a certain feature of other embodiment. The scope of the embodiment of the invention includes the whole scope of the claims and all obtainable equivalents thereof. Herein, these embodiments of the invention may be individually or generally represented by the term "invention" for the sake of convenience; moreover, if more than one invention is disclosed actually, it is not intended certainly to limit the application scope to any individual invention or inventive concept.

While the following description of various principles and features of the method and system can be applied to various communication systems, but for illustrative purposes, these embodiments will be described in the context in the wireless communication system later on. However, in the case of using other communication systems operating with different communication protocols, general principle described below is applicable. Of course, the scope of the invention be defined the claims appended hereto, and the scope is not limited by the particular embodiments described below.

The purpose of the present invention is to generate the parity check matrix on the basis of the generating sequence corresponded to the preserved row generator; encode the input data by the generating matrix obtained by said parity check matrix, thus, less storage space is needed for storing the generating sequence corresponded to the row generator, which could solve the problem of the necessary of too much storage space for parity check matrix.

Figure 1:
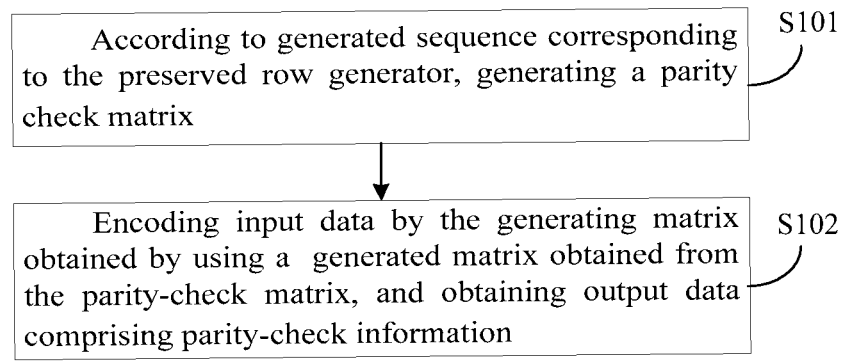
FIG. 1 illustrates the flowchart of the method for data transmission provided a embodiment in the present invention.

FIG. 1 is the illustrative flowchart of a method for data transmission provided in the present invention, as referred to FIG. 1, said method comprises the following steps:

Step 101: generating the parity check matrix H on the basis of the generating sequence corresponded to the preserved row generator.

In this example, according to a predetermined code length, coding rate and dimension, sub-matrix, determining the number of rows and columns in the constructing parity check matrix, and dividing said parity check matrix to arrays in submatrix. Wherein, the column number is the length of LDPC code, represented by N; the row number is the length of check bits, represented by M, the information bits length K=N−M. γ represents the column weight, λ represents the row weight, R represents the code rate, ρ represents the number of row generators, thus, the LDPC code could be expressed as (N,K) LDPC code, and assuming the constructing parity check matrix H of the LDPC code in the embodiments in the present invention to be expressed as the following form:

$$H = \begin{bmatrix} A_{0,0} & A_{0,1} & \ldots & A_{0,c-1} \\ A_{1,0} & A_{1,1} & \ldots & A_{1,c-1} \\ \vdots & \vdots & \ddots & \vdots \\ A_{\rho-1,0} & A_{\rho-1,1} & \ldots & A_{\rho-1,c-1} \end{bmatrix}$$

Wherein, $A_{i,j}$ is a t×t matrix, called as the submatrix of the parity check matrix H, the row weight of which is 0 or 1, H is a M×N full rank matrix.

The codeword characterized by matrix H is called (N, K) LDPC code, wherein, N=c×t is the code length, K=(c−ρ)×t represents the length of the encoded information bits, the encoding rate thereof is R=K/N. the first row of $A_i$=[$A_{i,0}$, $A_{i,1}$ . . . ,$A_{i,c-1}$], i=0, 2, . . . , ρ−1 is called as the ith row generator of H, thus, H comprises ρ row generators totally.

Wherein, it has ρ=M/t rows of submatrixes totally, each row has c=N/t submatrixes.

The parity check matrix is constituted by submatrixes of ρ rows and c columns, the dimension of each submatrix is t×t, thus the dimension of the parity check matrix H is (ρ·t)×(c·t). The column number of the parity check matrix is the code length of LDPC code, which is the code length N=c·t.

Next, determining the elements in the first row of the submatrixes in each row on the basis of the generating sequence corresponded to each row generators and the row weight, specifically:

The submatrixes in the ith row of the parity check matrix (wherein, 0≤i<ρ), could be generated by the first row of the submatrixes in the ith row, so the first row of the submatrix in the ith row is called the ith row generator, thus H has ρ row generators totally. In the ith (0≤i<ρ) row generator, the number of the column (the range is 0~N−1), where the element 1 exists, is called the ith generating sequence of matrix H, thus, ρ row generators of matrix H is corresponded to ρ generating sequences.

For regular LDPC code and irregular LDPC codes, if λ represents the row weight, ρ represents the row number of submatrixes in check matrix, because every λ digits in the generating sequence of one row represents the number of column where the element 1 exits in the first row of submatrixes in one row, thus, the generating sequence of said row consists λ×ρ digits, compared to M×N, the needed storage space is greatly reduced; for the irregular LDPC code, the row weight of which is not the same, although the row weight is not determined, however, the number of digits contained in the generating sequence of the row is at most the multiple of the maximum row weight and ρ, so, compared to M×N, the needed storage space is greatly reduced too.

Then, evenly dividing the submatrixes of each row, the value of the first row of which has been determined, to c submatrixes by column; wherein, because the submatrix in parity check matrix in this embodiment is t×t matrix, and the code length is N, the submatrix number in each row's submatrixes is c=N/t; after dividing, the parity check matrix in this embodiment is divided to ρ×(N/t) submatrixes, the dimension of which is t×t, and the value of the elements in the first row of each submatrix is determined.

Finally, based on the elements in the first row of each submatrix, obtaining the elements in other rows of the whole submatrix by cyclic shift or directly addressing, thus generating the whole parity check matrix H.

The cyclic shift is specifically:

Each row in the submatrix is obtained by rightly cyclic shift one bit of last row, wherein, the first row is obtained by cyclic shift of the final row. For each submatrix, the value of the elements in the other row could be obtained by cyclic shift of the elements in the first row thereof. For example, the elements of second row could be obtained by rightly cyclic shift w bits of the first row; the elements of third row could be obtained by rightly cyclic shift w bits of the second row, and so on, the value of all elements in the second row to the tth row could be obtained. The shift could also be left cyclic shift or other cyclic shift mode.

The directly addressing is specifically:

ρ generating sequences, the code length of which is N and the code rate of which is R, is corresponded to ρ rows of submatrixes, the submatrix number in each row is N/t. thus the parity check matrix, the code length of which is N and the code rate of which is R, comprises ρ*(N/t) submatrixes, the dimension of which is t×t.

First, taking the jth element $x_{i,j-1}^{(1)}$ in the i+1th generating sequence $x_i^{(1)}=[x_{i,0}^{(1)}, x_{i,1}^{(1)}, L, x_{i,l_i-1}^{(1)}]$, 0≤i<ρ, to generate the submatrix $A_{i,n}$ in the i+1th row, n+1th column, wherein n=floor($x_{i,j-1}^{(1)}/t$), i represents the label of the generating sequence, represents the i+1th generating sequence; j represents the element serial number of each generating sequence, $l_i$ represents the number of elements in the ith generating sequence. In the first row $[a_{0,0}, a_{0,1}, L, a_{0,t-1}]=[a_0, a_1, L, a_{t-1}]$ in submatrix $A_{i,n}=[a_{l,m}]$, 0≤l<t; 0≤l<t, only the mod($x_{i,j-1}^{(1)}$,t)+1th element is 1, the other t−1 elements are all 0.

Next, generating the whole matrix $A_{i,n}$ on the basis of the first row $[a_0, a_1, L, a_{t-1}]$, the process is: $a_{l,m}=a_{mod(m-l,t)}$, 0≤l<t; 0≤m<t, l represents the number of row where the element exists in each submatrix, m represents the number of column where the element exists in each submatrix. Each non-zero element in the generating sequence is corresponded to one non-zero matrix, other submatrixes are all zero matrixes, the dimension of which is t×t.

The above process could be interpreted as: determining the dimension of the submatrix on the basis of the code length, the code rate and the row weight, generating the submatrix by one element in the generating sequence, and in the first row of the generated submatrix, only one element is 1, other elements are all 0; the position of the element 1 is determined by the digit in the generating sequence, according to the following principle: obtaining the position information of element 1 by carrying out the divisible principle to the digit, thus the first row of submatrix could be determined, the position of element 1 in other rows except the first row in the submatrix could be obtained by directly addressing on the basis of the elements in the first row, that is, the position of element 1 in other rows except the first row in the submatrix is corresponded to the first row. The relationship is that: after the minus of the column number to the row number of any row except the first row, the modulo of the dimension is equal to the column number of the first row. Each non-zero element in the generating sequence is corresponded to one non-zero matrix, other submatrixes are all zero matrixes.

After the above progress, the parity check matrix is obtained. Assuming the set generating sequence, corresponded to the row generator used for generating the parity check matrix, contains y digitals, the obtained check matrix contains y submatrixes which contain element 1, as known from the characteristic of the matrix, these submatrixes containing element 1 are substitution unit matrix.

In this step, after obtaining the parity check matrix, carrying out the transforming such as rotating by any angle, row substitution, column substitution or position changing of submatrix.

Step 102: encoding the input data by the generating matrix obtained by said parity check matrix.

Obtaining the corresponding generating matrix G from said parity check matrix H by the same means in the present technology. Wherein, said generating matrix G and the corresponding parity check matrix H are dual matrix.

Said generating matrix G and the corresponding parity check matrix H are dual matrix.

Preferably, obtaining generating matrix G by the following process:

The generating matrix G corresponded to check matrix H could be expressed as:

G=[I|P], wherein, I is unit matrix, the matrix P could be expressed as:

$$P = \begin{bmatrix} P_{0,0} & P_{0,1} & \cdots & P_{0,\rho-1} \\ P_{1,0} & P_{1,1} & \cdots & P_{1,\rho-1} \\ \vdots & \vdots & \ddots & \vdots \\ P_{c-\rho-1,0} & P_{c-\rho-1,1} & \cdots & P_{c-\rho-1,\rho-1} \end{bmatrix}$$

Wherein, $P_{i,j}$ is t×t cyclic matrix, each column of the matrix is obtained from the last column by down cyclic shift 1 bit, wherein, the first column is obtained from the final column by down cyclic shift. The first column of $P_j=[P_{0,j}, P_{1,j}, \ldots P_{c-\rho-1,j}]^T$, j=0, 1, ..., ρ−1 is called the j+1th column generator of generating matrix G, thus G has P column generators totally.

This embodiment only illustrates one representation of the generating matrix G as above, however, the invention is not limited to the above representation, other method for obtaining G matrix from H matrix and G matrix is not beyond the scope of the present invention.

In this step, after obtaining the generating matrix G, encoding the input data, transforming the input data to LDPC code words, obtaining the output data which comprises the parity check information.

Preferably, LDPC code is linear block code, the encoding process could be expressed as:

$c=\tilde{b} \cdot G$

Wherein, $\tilde{b}=(\tilde{b}_0, \tilde{b}_1, \ldots, \tilde{b}_{K-1})$ is K encode information bits, $c=(\tilde{b}_0, \tilde{b}_1, \ldots, \tilde{b}_{K-1}, v_0, v_1, \ldots, v_{N-K-1})$ is the codeword, the length of which is N, $v=(v_0, \ldots, v_{N-K-1})$ is N-K check bits, and the encoding codeword satisfies the check equation $H \cdot c^T=0$.

Preferably, the encoding progress of LDPC code could also be expressed as:

$x=u \cdot G$

Wherein, $u=(u_0, u_1, L, u_{K-1})$ is K encode information bits, $x=(u_0, u_1, L, u_{K-1}, v_0, v_1, L, v_{N-K-1})$ is the codeword, the length of which is N, $v=(v_1,L,v_{N-K-1})$ is N-K check bits, and the encoding codeword satisfies the check equation $H \cdot x^T=0$.

The encoding of the input data could also apply other method in the present technology.

Above is the illustrative process of a method for data transmission in the present invention.

In the above method, the determining of the generating sequence corresponded to the preserved row generator, which is matched to the code length, code rate and the dimension of submatrix, is carried out when the code length, the code rate and the dimension of the submatrix is selected. Besides, lots of methods are prepared for the selecting of the code length and code rate of multiple code rate LDPC code, one available method is to determine the code length by the principle of the highest spectral efficiency, on the basis of the length of transmitting package indicated by the upper layer. When the code length is determined, first using the codeword having the highest code rate with said code length, determining whether the code rate could be used according to measure principle of PER, if the transmitting PER is higher than the threshold, reducing the code rate to the neighboring lower one, until the lowest code rate. Above is a example for the selecting, the present invention is not limited to the above method for the selecting, other methods realizing the selection of the code length, code rate and the dimension of submatrix of LDPC code is not beyond the scope of the present invention.

In the practical application, after the interleaving and modulating of the data, which is obtained after the method for data transmission in the present invention, it could be transmitted out. Wherein, the modulation include: QAM, PSK, APSK, DPSK, BPSK, DAPSK, OFDM, etc. the modulated signal could be transmitted through various kinds of communication systems, including the terrestrial links which support mobile multimedia broadcasting and others, for example: it could be transmitted through Terrestrial Mobile Multimedia Broadcasting (T-MMB) system.

The code length, code rate, information bits length, cyclical submatrix size of LDPC code is illustrated in table 1.

TABLE 1

| N | K | R | t |
|---|---|---|---|
| 1344 | 672 | ½ | 42 |
| 1344 | 840 | ⅝ | 42 |
| 1344 | 1008 | ¾ | 42 |
| 1344 | 1176 | ⅞ | 42 |
| 2688 | 1344 | ½ | 112 |
| 2688 | 1680 | ⅝ | 112 |
| 2688 | 2016 | ¾ | 112 |
| 2688 | 2240 | ⅚ | 112 |
| 5376 | 2688 | ½ | 112 |
| 5376 | 3360 | ⅝ | 112 |
| 5376 | 4032 | ¾ | 112 |
| 5376 | 4704 | ⅞ | 112 |

The present invention could be applied to regular LDPC code and irregular LDPC code, the following is the detailed description of the technical schemes in the present invention through 12 embodiments.

The First Embodiment

This embodiment takes (1344, 672) irregular LDPC code as an example. The code length N of the irregular LDPC code realized in this embodiment is 1344, the information bits length K is 672, the row weight $\lambda=7$, the code rate v=½. It could be known from the relationship of the code rate, code length and the number of check equations that, the number of check equations M of the check matrix in this embodiment is M=1344−672=672. In this embodiment, the submatrix, the dimension of which is 42×42, as the minimum unit, is took as the example to illustrate the realization process of LDPC code.

The flowchart of the method in this embodiment is similar to the flowchart of the illustrative method shown in FIG. 1, referred to FIG. 1, the realization method of the LDPC code comprises the following steps:

In step 101, generating the parity check matrix on the basis of the generating sequence corresponded to the preserved row generator.

The row generator of (1344,672) LDPC code is illustrated in table 2, the (i+1) th row in the table is corresponded to the generating sequence of the (i+1) th row generator (0≤i<16).

TABLE 2

| |
|---|
| 156 326 342 444 575 898 1005 |
| 55 85 167 486 617 1047 1307 |
| 410 821 873 927 982 1106 1191 |
| 10 61 139 251 468 773 915 |
| 52 103 324 400 612 743 792 |
| 26 70 145 195 502 718 1108 |
| 31 68 112 187 544 578 1313 |
| 73 110 229 307 337 681 1192 |
| 18 196 271 379 806 1168 1267 |
| 60 121 262 391 421 548 1088 |
| 25 163 355 433 652 712 1067 |
| 96 144 505 618 632 1172 1251 |
| 5 109 138 186 320 517 846 |
| 35 47 151 228 671 716 1256 |
| 0 89 270 367 713 1032 1298 |
| 20 42 119 131 235 264 956 |

First, determining the number of rows and columns in said constructing parity check matrix on the basis of preset code length, code rate and the dimension of submatrix, and dividing said parity check matrixes into arrays in the unit of submatrix.

The parity check matrix, the code length of which is 1344, the code rate is ½, contains 16 row generators totally, each row generator is corresponded to one row osubmatrixes, each row has 32 submatrixes. Thus, the parity check matrix, the code length of which is 1344, the code rate is ½, contains 16×32 submatrixes, the dimension of which is 42×42.

Then determining the elements in the first row of each submatrix on the basis of the generating sequence corresponded to said row generator and the row weight.

Referred to table 2, each row in the table is the generating sequence corresponded to one row generator, each generating sequence corresponded to one row generator represents the number of column where element 1 locates in the first row of one row osubmatrixes (the range: 0~N−1, N=1344).

Because the row weight of the LDPC code in this embodiment is 7, 7 elements 1 locate in the first row of each row osubmatrixes, which is, 7 rows exists, the value of which is 1; furthermore, the submatrix in the parity check matrix in this embodiment is 42×42 matrix, and the number of check equations is 672, so, the row number ρ of the submatrix in the parity check matrix ρ=672/42=16, therefore, all generating sequences corresponded to 16 row generators in this embodiment contain 192 digits, which is 16 rows×7 columns. Wherein, each 7 digits is grouped as one generating sequence, which represents the number of columns where element 1 locates in the first row of one submatrixes.

Table 2 contains several generating sequences comprising digits, the number of which is equal to the row weight. Taking the digits in each row of generating sequences in table 2 as the number of columns where element 1 locates in the first row of each corresponded row osubmatrixes. Which is, taking the digits in the first row of generating sequences in table 2 as the number of column where element 1 locates in the first row of the first row osubmatrixes, taking the digits in the second row of generating sequences in table 2 as the number of column where element 1 locates in the second row of the first row osubmatrixes, and so on, taking the digits in the final row of generating sequences in table 2 as the number of column where element 1 locates in the first row of the final row submatrixes.

Specifically, evenly dividing table 2 into several generating sequences containing 7 digits, obtaining the elements in the first row of each row osubmatrixes in the parity check matrix on the basis of the obtained digits in each row of generating sequences, which is, the digits in each row illustrated in table 2.

For example, as shown in table 2, the first row of generating sequence is 156, 326, 342, 444, 575, 898 and 1005, which means the first row of the first row osubmatrixes in the parity check matrix, which is the value of the 157th, 327th, 343th, 445th, 576th, 899th and 1006th column in the first row in the parity check matrix is 1, other columns in the first row osubmatrixes are all 0;

the second row of generating sequence is 55, 85, 167, 486, 617, 1047 and 1307, which means the first row of the second row osubmatrixes in the parity check matrix, which is the value of the 55th, 86th, 168th, 487th, 618th, 1048 th and 1308th column in the 43th row in the parity check matrix is 1, other columns in the first row in the second row osubmatrixes are all 0, the value of elements in the first row of other row osubmatrixes, could be obtained as the above example, which is not described hereinafter.

Evenly dividing each row osubmatrixes, the value of the first row of which is determined, to c submatrixes in column; here, because the submatrix of the parity check matrix in this embodiment is 42×42 matrix, and the code length is 1344, each row has c=1344/42=32 submatrixes; after dividing, the parity check matrix is divided to 16(row)×32(column)=512 submatrixes, the dimension of which is 42×42, and the value of elements in the first row of each submatrix is determined.

Finally, obtaining the elements in the other rows of the submatrix, on the basis of the elements in the first row of each submatrix, by cyclic shift or directly addressing.

The detailed realization process is the same as step 101, which is not described hereinafter.

After the above steps, the parity check matrix H could be obtained. Because 16(row)×7(column)=112 digits exist in the generating sequence in table 1 in this embodiment. 112 substitution unit matrixes exist in the parity check matrix in this embodiment.

In this step, after obtaining the parity check matrix, carrying out the transforming such as rotating by any angle, row substitution, column substitution or position changing of submatrix.

In step 102, encoding said input data by the generating matrix G obtained from parity check matrix H, and transforming to LDPC codewords, obtaining the output data containing the parity check information.

Above is the illustrative process of the method for data transmission in the first embodiment in the present invention.

It could be got from the above embodiments that, the present invention uses the generating sequence corresponded to the row generator to represent the parity check matrix, and obtains the parity check matrix by cyclic shift or directly addressing of the row generator, and makes the parity check matrix take the minimum storage space.

Figure 2:
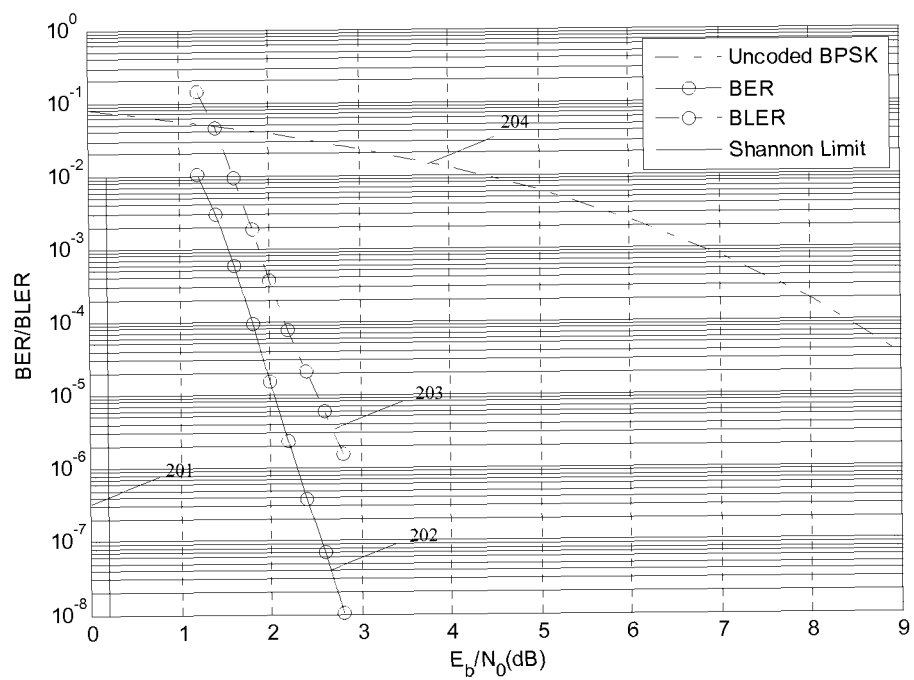
FIG. 2 illustrates the performance of (1344, 672) LDPC code provided in the first embodiment in the present invention.

The following is the emulation comparison with the present technology, to show the performance of the (1344, 672) irregular LDPC code provided in the first embodiment in the present invention. FIG. 2 is the illustration of the comparison of the BER/BLER performance of (1344, 672) LDPC code, with BPSK modulation, on AWGN channel in the first embodiment, and the performance of Shannon Limit, without encoding BPSK. In the emulation, the decoding takes sum-product algorithm, with maximum 50 iterative time.

Referred to FIG. 2, wherein, straight row 201 represents the Shannon Limit;

curve 202 represents the BER of the signal, which is encoded with (1344,672) irregular LDPC code in the present invention, modulated by BPSK, then transmitted through AWGN channel, and decoded with the algorithm of Sum-Product Arithmetic(SPA).

Curve 203 represents the BLER of the signal, which is encoded with (1344,672) irregular LDPC code in the present invention, modulated by BPSK, then transmitted through AWGN channel, and decoded with the algorithm of Sum-Product Arithmetic(SPA).

Curve 204 represents the BER performance of the signal, which has not been encoded, modulated by BPSK, and transmitted through AWGN channel.

The Second Embodiment

This embodiment takes (1344, 840) irregular LDPC code as an example. The code length N of the irregular LDPC code realized in this embodiment is 1344, the information bits length K is 672, the row weight $\lambda=10$, the code rate v=⅝. It could be known from the relationship of the code rate, code length and the number of check equations that, the number of check equations M of the check matrix in this embodiment is M=1344−840=504. In this embodiment, the submatrix, the dimension of which is 42×42, as the minimum unit, is took as the example to illustrate the realization process of LDPC code.

The flowchart of the method in this embodiment is similar to the flowchart of the illustrative method shown in FIG. 1, referred to FIG. 1, the realization method of the LDPC code comprises the following steps:

In step 101, generating the parity check matrix on the basis of the generating sequence corresponded to the preserved row generator.

The row generator of (1344,840) LDPC code is illustrated in table 3, the (i+1) th row in the table is corresponded to the generating sequence of the (i+1) th row generator ($0 \leq i < 12$).

TABLE 3

| |
| --- |
| 265 295 377 408 422 544 578 696 722 1176 |
| 122 201 244 279 307 337 450 464 885 1295 |
| 164 243 321 349 379 461 492 916 927 1015 |
| 120 262 363 391 421 503 548 720 765 958 |
| 8 185 280 304 355 576 712 762 1190 1229 |
| 24 50 204 278 322 447 618 804 1042 1108 |
| 66 283 320 364 388 439 660 899 1257 1313 |
| 134 289 325 406 430 531 838 1004 1137 1316 |
| 150 214 367 404 448 523 601 880 983 1073 |
| 40 90 264 409 615 643 786 862 1088 1276 |
| 277 306 354 415 532 607 657 685 828 1130 |
| 64 319 348 396 457 493 574 727 870 1172 |

First, determining the number of rows and columns said constructing parity check matrix on the basis of preset code length, code rate and the dimension of submatrix, and dividing said parity check matrixes into arrays in the unit of submatrix.

The parity check matrix, the code length of which is 1344, the code rate is 5/8, contains 12 row generators totally, each row generator is corresponded to 12 row submatrixes, each row has 32 submatrixes. Thus, the parity check matrix, the code length of which is 1344, the code rate is 5/8, contains 12×32 submatrixes, the dimension of which is 42×42.

Then determining the elements in the first row of each submatrix on the basis of the generating sequence corresponded to said row generator and the row weight.

Referred to table 3, each row in the table is the generating sequence corresponded to one row generator, each generating sequence corresponded to one row generator represents the number of column where element 1 locates in the first row of one row osubmatrixes (the range: 0~N−1, N=1344).

Because the row weight of the LDPC code in this embodiment is 10, 10 elements 1 locate in the first row of each row osubmatrixes, which is, 10 columns exists, the value of which is 1; furthermore, the submatrix in the parity check matrix in this embodiment is 42×42 matrix, and the number of check equations is 504, so the row number ρ of the submatrix in the parity check matrix ρ=504/42=12, therefore, in table 3 of this embodiment contain 120 digits, which is 12 rows×10 columns.

Table 3 contains several generating sequences comprising digits, the number of which is equal to the row weight. Taking the digits in each row of generating sequences in table 3 as the number of columns where element 1 locates in the first row of each corresponded row osubmatrixes. Which is, taking the digits in the first row of generating sequences in table 3 as the number of column where element 1 locates in the first row of the first row osubmatrixes, taking the digits in the second row of generating sequences in table 3 as the number of column where element 1 locates in the second row of the first row osubmatrixes, and so on, taking the digits in the final row of generating sequences in table 3 as the number of column where element 1 locates in the first row of the final row osubmatrixes.

Specifically, evenly dividing table 3 into several generating sequences containing 10 digits, obtaining the elements in the first row of each row osubmatrixes in the parity check matrix on the basis of the obtained digits in each row of generating sequences, which is, the digits in each row illustrated in table 3.

For example, as shown in table 3, the first row of generating sequence is 265, 295, 377, 408, 422, 544, 578, 696, 722, 1176, which means the first row of the first row osubmatrixes in the parity check matrix, which is the value of the 266th, 296th, 378th, 409th, 423th, 545th, 579th, 697th, 723th and 1177th column in the first row in the parity check matrix is 1, other columns in the first row osubmatrixes are all 0;

Evenly dividing each row osubmatrixes, the value of the first row of which is determined, to C submatrixes in column; here, because the submatrix of the parity check matrix in this embodiment is 42×42 matrix, and the code length is 1344, each row has c=1344/42=32 submatrixes; after dividing, the parity check matrix is divided to 12(row)×32(column)=384 submatrixes, and the value of elements in the first row of each submatrix is determined.

Finally, obtaining the elements in the other rows of the submatrix, on the basis of the elements in the first row of each submatrix, by cyclic shift or directly addressing.

The detailed realization process is the same as step 101, which is not described hereinafter.

After the above steps, the parity check matrix H could be obtained. Because 12(row)×10(column)=120 digits exist in the generating sequence in table 1 in this embodiment. 120 substitution unit matrixes exist in the parity check matrix in this embodiment.

In this step, after obtaining the parity check matrix, carrying out the transforming such as rotating by any angle, row substitution, column substitution or position changing of submatrix.

In step 102, encoding said input data by the generating matrix G obtained from parity check matrix H, and transforming to LDPC codewords, obtaining the output data containing the parity check information.

Above is the illustrative process of the method for data transmission in the second embodiment in the present invention.

It could be got from the above embodiments that, the present invention uses the generating sequence corresponded to the row generator to represent the parity check matrix, and obtains the parity check matrix by cyclic shift or directly addressing of the row generator, and makes the parity check matrix take the minimum storage space.

Figure 3:
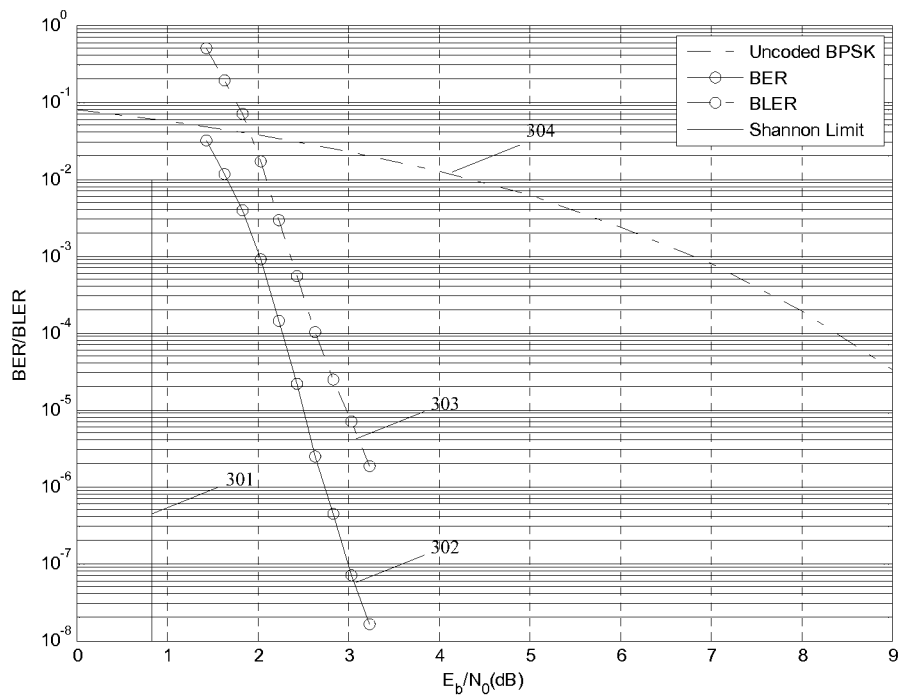
FIG. 3 illustrates the performance of (1344, 840) LDPC code provided in the second embodiment in the present invention.

The following is the emulation comparison with the present technology, to show the performance of the (1344, 840) irregular LDPC code provided in the second embodiment in the present invention. FIG. 3 is the illustration of the comparison of the BER/BLER performance of (1344,840) LDPC code, with BPSK modulation, on AWGN channel in the second embodiment, and the performance of Shannon Limit, without encoding BPSK. In the emulation, the decoding takes sum-product algorithm, with maximum 50 iterative time.

Referred to FIG. 3, wherein, straight row 301 represents the Shannon Limit;

Curve 302 represents the BER of the signal, which is encoded with (1344,840) irregular LDPC code in the present invention, modulated by BPSK, then transmitted through AWGN channel, and decoded with the algorithm of Sum-Product Arithmetic(SPA).

Curve 303 represents the BLER of the signal, which is encoded with (1344,840) irregular LDPC code in the present invention, modulated by BPSK, then transmitted through AWGN channel, and decoded with the algorithm of Sum-Product Arithmetic(SPA).

Curve 304 represents the BER performance of the signal, which has not been encoded, modulated by BPSK, and transmitted through AWGN channel.

The Third Embodiment

This embodiment takes (1344, 1008) irregular LDPC code as an example. The code length N of the irregular LDPC code realized in this embodiment is 1344, the information bits length K is 1008, the row weight λ=15, the code rate v=3/4. It could be known from the relationship of the code rate, code length and the number of check equations that, the number of check equations M of the check matrix in this embodiment is M=1344−1008=336. In this embodiment, the submatrix, the dimension of which is 42×42, as the minimum unit, is took as the example to illustrate the realization process of LDPC code.

The flowchart of the method in this embodiment is similar to the flowchart of the illustrative method shown in FIG. 1, referred to FIG. 1, the realization method of the LDPC code comprises the following steps:

In step 101, generating the parity check matrix on the basis of the generating sequence corresponded to the preserved row generator.

The row generator of (1344,1008) LDPC code is illustrated in table 4, the (i+1) th row in the table is corresponded to the generating sequence of the (i+1) th row generator (0≤i<8).

TABLE 4

3 91 140 223 253 335 366 502 536 680 718 785 1089 1103 1253
34 165 237 265 295 377 408 422 544 594 899 989 1106 1295 1307
76 87 279 337 419 450 464 586 681 764 918 1004 1031 1066 1145
207 220 271 321 379 568 628 662 806 960 1053 1099 1148 1187 1302
238 262 313 363 391 503 534 548 720 765 822 848 953 1025 1173
80 236 280 304 355 405 433 463 576 590 652 890 928 1044 1232
36 159 171 241 278 322 346 397 447 475 505 632 754 849 1274
78 101 202 247 320 364 388 439 517 547 674 830 846 974 1192

First, determining the number of rows and columns in said constructing parity check matrix on the basis of preset code length, code rate and the dimension of submatrix, and dividing said parity check matrixes into arrays in the unit of submatrix.

The parity check matrix, the code length of which is 1344, the code rate is ¾, contains 8 row generators totally, each row generator is corresponded to 8 rowsubmatrixes, each row has 32 submatrixes. Thus, the parity check matrix, the code length of which is 1344, the code rate is ½, contains 8×32 submatrixes, the dimension of which is 42×42.

Then determining the elements in the first row of each submatrix on the basis of the generating sequence corresponded to said row generator and the row weight.

Referred to table 4, each row in the table 4 is the generating sequence corresponded to one row generator, each generating sequence corresponded to one row generator represents the number of column where element 1 locates in the first row of one row osubmatrixes (the range: 0~N−1, N=1344).

Because the row weight of the LDPC code in this embodiment is 15, 15 elements 1 locate in the first row of each row osubmatrixes, which is, 15 columns exists, the value of which is 1; furthermore, the submatrix in the parity check matrix in this embodiment is 42×42 matrix, and the number of check equations is 336, so, the row number ρ of the submatrix in the parity check matrix ρ=336/42=8, therefore, in this embodiment contain 120 digits, which is 8 rows×15 columns.

Table 4 contains several generating sequences comprising digits, the number of which is equal to the row weight. Taking the digits in each row of generating sequences in table 4 as the number of columns where element 1 locates in the first row of each corresponded row osubmatrixes. Which is, taking the digits in the first row of generating sequences in table 4 as the number of column where element 1 locates in the first row of the first row osubmatrixes, taking the digits in the second row of generating sequences in table 4 as the number of column where element 1 locates in the second row of the first row osubmatrixes, and so on, taking the digits in the final row of generating sequences in table 4 as the number of column where element 1 locates in the first row of the final row osubmatrixes.

Specifically, evenly dividing table 4 into several generating sequences containing 15 digits, obtaining the elements in the first row of each row osubmatrixes in the parity check matrix on the basis of the obtained digits in each row of generating sequences, which is, the digits in each row illustrated in table 4.

For example, as shown in table 4, the first row of generating sequence is 3, 91, 140, 223, 253, 335, 366, 502, 536, 680, 718, 785, 1089, 1103 and 1253, which means the first row of the first row osubmatrixes in the parity check matrix, which is the value of the 4th, 92th, 141th, 224th, 254th, 336th, 367th, 503th, 537th, 681th, 719th, 786th, 1090th, 1104th, 1254th column in the first row in the parity check matrix is 1, other columns in the first row osubmatrixes are all 0;

Evenly dividing each row osubmatrixes, the value of the first row of which is determined, to c submatrixes in column; here, because the submatrix of the parity check matrix in this embodiment is 42×42 matrix, and the code length is 1344, each row has c=1344/42=32 submatrixes; after dividing, the parity check matrix is divided to 8(row)×15 (column)=120 submatrixes, the dimension of which is 42×42, and the value of elements in the first row of each submatrix is determined.

Finally, obtaining the elements in the other rows of the submatrix, on the basis of the elements in the first row of each submatrix, by cyclic shift or directly addressing.

The detailed realization process is the same as step 101, which is not described hereinafter.

After the above steps, the parity check matrix H could be obtained. Because 8(row)×15(column)=120 digits exist in the generating sequence in table 1 in this embodiment. 120 substitution unit matrixes exist in the parity check matrix in this embodiment.

In this step, after obtaining the parity check matrix, carrying out the transforming such as rotating by any angle, row substitution, column substitution or position changing of submatrix.

In step 102, encoding said input data by the generating matrix G obtained from parity check matrix H, and transforming to LDPC codewords, obtaining the output data containing the parity check information.

Above is the illustrative process of the method for data transmission in the third embodiment in the present invention.

It could be got from the above embodiments that, the present invention uses the generating sequence corresponded to the row generator to represent the parity check matrix, and obtains the parity check matrix by cyclic shift or directly addressing of the row generator, and makes the parity check matrix take the minimum storage space.

Figure 4:
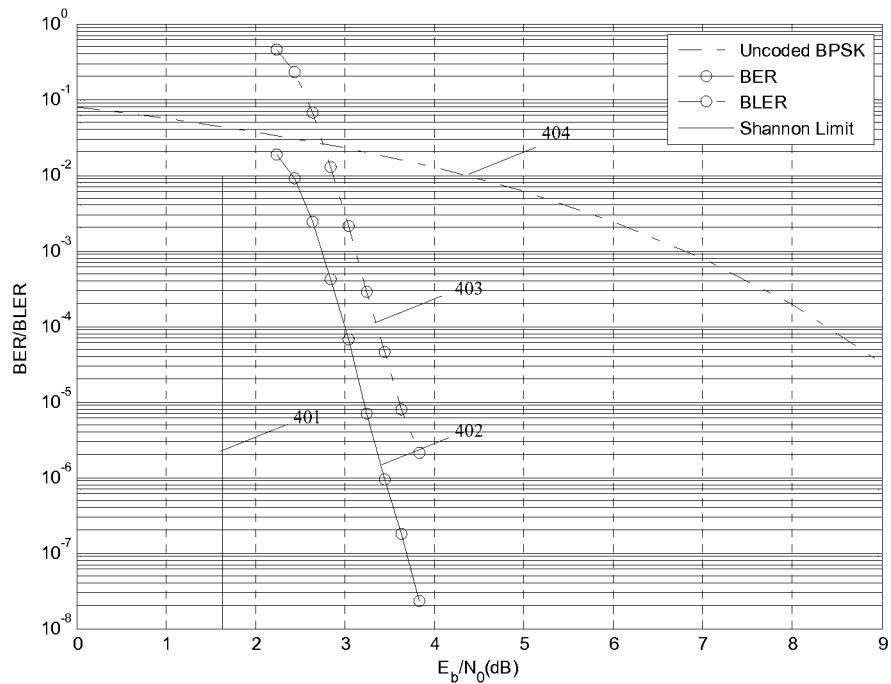
FIG. 4 illustrates the performance of (1344, 1008) LDPC code provided in the third embodiment in the present invention.

The following is the emulation comparison with the present technology, to show the performance of the (1344, 1008) irregular LDPC code provided in the third embodiment in the present invention. FIG. 4 is the illustration of the comparison of the BER/BLER performance of (1344, 1008) LDPC code, with BPSK modulation, on AWGN channel in the first embodiment, and the performance of Shannon Limit, without encoding BPSK. In the emulation, the decoding takes sum-product algorithm, with maximum 50 iterative time.

Referred to FIG. 4, wherein, straight row 401 represents the Shannon Limit;

Curve 402 represents the BER of the signal, which is encoded with (1344,1008) irregular LDPC code in the present invention, modulated by BPSK, then transmitted through AWGN channel, and decoded with the algorithm of Sum-Product Arithmetic(SPA).

Curve 403 represents the BLER of the signal, which is encoded with (1344,1008) irregular LDPC code in the present invention, modulated by BPSK, then transmitted through AWGN channel, and decoded with the algorithm of Sum-Product Arithmetic(SPA).

Curve 404 represents the BER performance of the signal, which has not been encoded, modulated by BPSK, and transmitted through AWGN channel.

The 4th Embodiment

This embodiment takes (1344,1176) irregular LDPC code as an example. The code length N of the irregular LDPC code realized in this embodiment is 1344, the information bits length K is 1176, the row weight $\lambda$=28, the code rate $v$=⅞. It could be known from the relationship of the code rate, code length and the number of check equations that, the number of check equations M of the check matrix in this embodiment is M=1344−1176=168. In this embodiment, the submatrix, the dimension of which is 42×42, as the minimum unit, is took as the example to illustrate the realization process of LDPC code.

The flowchart of the method in this embodiment is similar to the flowchart of the illustrative method shown in FIG. 1, referred to FIG. 1, the realization method of the LDPC code comprises the following steps:

In step 101, generating the parity check matrix on the basis of the generating sequence corresponded to the preserved row generator.

The row generator of (1344,1176) LDPC code is illustrated in table 5, the (i+1) th row in the table is corresponded to the generating sequence of the (i+1) th row generator (0≤i<4).

TABLE 5

| |
|---|
| 55 85 167 198 212 274 334 368 384 429 486 512 550 617 666 689 752 779 874 885 940 973 1047 1064 1103 1149 1253 1265 |
| 20 69 97 127 209 240 254 316 376 410 426 471 528 554 592 659 708 731 794 821 873 927 982 1015 1089 1145 1191 1307 |
| 15 61 111 139 169 251 282 296 358 418 452 468 513 570 596 634 701 750 773 836 863 915 969 1131 1148 1187 1238 1260 |
| 11 52 103 153 181 211 293 324 338 400 460 494 510 555 612 638 676 743 792 815 905 957 1011 1066 1099 1190 1233 1302 |

First, determining the number of rows and columns in said constructing parity check matrix on the basis of preset code length, code rate and the dimension of submatrix, and dividing said parity check matrixes into arrays in the unit of submatrix.

The parity check matrix, the code length of which is 1344, the code rate is ⅞, contains 4 row generators totally, each row generator is corresponded to one row osubmatrixes, each row has 32 submatrixes. Thus, the parity check matrix, the code length of which is 1344, the code rate is ⅞, contains 4×28 submatrixes, the dimension of which is 42×42.

Then determining the elements in the first row of each submatrix on the basis of the generating sequence corresponded to said row generator and the row weight.

Referred to table 5, each row in the table is the generating sequence corresponded to one row generator, each generating sequence corresponded to one row generator represents the number of column where element 1 locates in the first row of one row osubmatrixes (the range: 0~N−1, N=1344).

Because the row weight of the LDPC code in this embodiment is 28, 28 elements 1 locate in the first row of each row osubmatrixes, which is, 28 columns exists, the value of which is 1; furthermore, the submatrix in the parity check matrix in this embodiment is 42×42 matrix, and the number of check equations is 168, so, the row number ρ of the submatrix in the parity check matrix ρ=168/42=4, therefore, in this embodiment contain 112 digits, which is 4 rows×28 columns.

Table 5 contains several generating sequences comprising digits, the number of which is equal to the row weight. Taking the digits in each row of generating sequences in table 5 as the number of columns where element 1 locates in the first row of each corresponded row osubmatrixes. Which is, taking the digits in the first row of generating sequences in table 5 as the number of column where element 1 locates in the first row of the first row osubmatrixes, taking the digits in the second row of generating sequences in table 5 as the number of column where element 1 locates in the second row of the first row osubmatrixes, and so on, taking the digits in the final row of generating sequences in table 5 as the number of column where element 1 locates in the first row of the final row osubmatrixes.

Specifically, evenly dividing table 5 into several generating sequences containing 28 digits, obtaining the elements in the first row of each row osubmatrixes in the parity check matrix on the basis of the obtained digits in each row of generating sequences, which is, the digits in each row illustrated in table 5.

For example, as shown in table 5, the first row of generating sequence is 55, 85, 167, 198, 212, 274, 334, 368, 384, 429, 486, 512, 550, 617, 666, 689, 752, 779, 874, 885, 940, 973, 1047, 1064, 1103, 1149, 1253 and 1265, which means the first row of the first row osubmatrixes in the parity check matrix, which is the value of the 56th, 86th, 168th, 199th, 213th, 275th, 335th, 369th, 385th, 430th, 487th, 513th, 551th, 618th, 667th, 690th, 753th, 780th, 875th, 886th, 941th, 974th, 1048th, 1065th, 1104th, 1150th, 1254th and 1266th column in the first row in the parity check matrix is 1, other columns in the first row osubmatrixes are all 0;

Evenly dividing each row osubmatrixes, the value of the first row of which is determined, to c submatrixes in column; here, because the submatrix of the parity check matrix in this embodiment is 42×42 matrix, and the code length is 1344, each row has c=672/42=16 submatrixes; after dividing, the parity check matrix is divided to 4(row)×28(column)=112 submatrixes, and the value of elements in the first row of each submatrix is determined.

Finally, obtaining the elements in the other rows of the submatrix, on the basis of the elements in the first row of each submatrix, by cyclic shift or directly addressing.

The detailed realization process is the same as step 101, which is not described hereinafter.

After the above steps, the parity check matrix H could be obtained. Because 4(row)×28(column)=112 digits exist in column generator of this embodiment. 112 substitution unit matrixes exist in the parity check matrix in this embodiment.

In this step, after obtaining the parity check matrix, carrying out the transforming such as rotating by any angle, row substitution, column substitution or position changing of submatrix.

In step 102, encoding said input data by the generating matrix G obtained from parity check matrix H, and transforming to LDPC codewords, obtaining the output data containing the parity check information.

Above is the illustrative process of the method for data transmission in the 4th embodiment in the present invention.

It could be got from the above embodiments that, the present invention uses the generating sequence corresponded to the row generator to represent the parity check matrix, and obtains the parity check matrix by cyclic shift or directly addressing of the row generator, and makes the parity check matrix take the minimum storage space.

Figure 5:
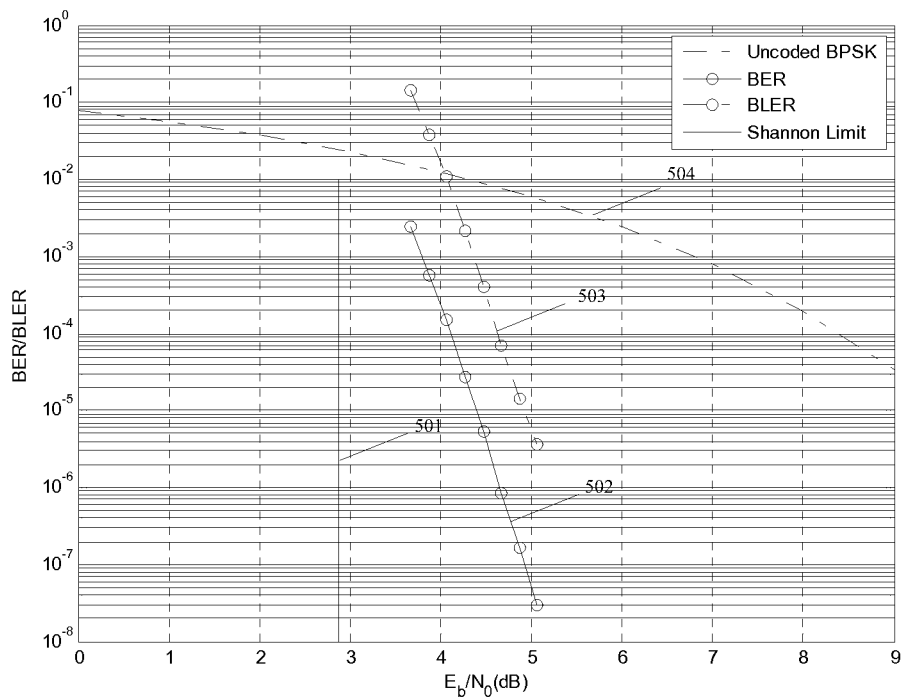
FIG. 5 illustrates the performance of (1344, 1176) LDPC code provided in the 4th embodiment in the present invention.

The following is the emulation comparison with the present technology, to show the performance of the (1344, 1176) irregular LDPC code provided in the first embodiment in the present invention. FIG. 5 is the illustration of the comparison of the BER/BLER performance of (1344,1176) LDPC code, with BPSK modulation, on AWGN channel in the first embodiment, and the performance of Shannon Limit, without encoding BPSK. In the emulation, the decoding takes sum-product algorithm, with maximum 50 iterative time.

Referred to FIG. 5, wherein, straight row 501 represents the Shannon Limit;

curve 502 represents the BER of the signal, which is encoded with (1344,1176) irregular LDPC code in the present invention, modulated by BPSK, then transmitted through AWGN channel, and decoded with the algorithm of Sum-Product Arithmetic(SPA).

Curve 503 represents the BLER of the signal, which is encoded with (1344,1176) irregular LDPC code in the present invention, modulated by BPSK, then transmitted through AWGN channel, and decoded with the algorithm of Sum-Product Arithmetic(SPA).

Curve 504 represents the BER performance of the signal, which has not been encoded, modulated by BPSK, and transmitted through AWGN channel.

The 5th Embodiment

This embodiment takes (2688, 1344) irregular LDPC code as an example. The code length N of the irregular LDPC code realized in this embodiment is 2688, the information bits length K is 1344, the row weight $\lambda=7$, the code rate $v=\frac{1}{2}$. It could be known from the relationship of the code rate, code length and the number of check equations that, the number of check equations M of the check matrix in this embodiment is M=2688−1344=1344. In this embodiment, the submatrix, the dimension of which is 112×112, as the minimum unit, is took as the example to illustrate the realization process of LDPC code.

The flowchart of the method in this embodiment is similar to the flowchart of the illustrative method shown in FIG. 1, referred to FIG. 1, the realization method of the LDPC code comprises the following steps:

In step 101, generating the parity check matrix on the basis of the generating sequence corresponded to the preserved row generator.

The row generator of (2688,1344) LDPC code is illustrated in table 6, the (i+1) th row in the table is corresponded to the generating sequence of the (i+1) th row generator ($0 \leq i < 12$).

TABLE 6

| |
|---|
| 417 582 1113 1518 2328 2388 2544 |
| 112 343 529 607 844 1405 1861 |
| 61 176 302 393 455 641 2054 |
| 259 414 505 753 918 1706 2166 |
| 248 371 526 943 1030 1257 1680 |
| 91 328 483 729 1292 1792 2390 |
| 440 595 841 1561 1613 1904 2502 |
| 265 434 552 707 1279 1547 2302 |
| 22 273 377 546 1127 1659 2645 |
| 134 283 489 808 931 1949 2077 |
| 256 497 770 888 920 1198 1351 |
| 278 368 1032 1155 1401 2173 2602 |

First, determining the number of rows and columns in said constructing parity check matrix on the basis of preset code length, code rate and the dimension of submatrix, and dividing said parity check matrixes into arrays in the unit of submatrix.

The parity check matrix, the code length of which is 2688, the code rate is ½, contains 12 row generators totally, each row generator is corresponded to one row osubmatrixes, each row has 24 submatrixes. Thus, the parity check matrix, the code length of which is 2688, the code rate is ½, contains 12×24 submatrixes, the dimension of which is 112×112.

Then determining the elements in the first row of each submatrix on the basis of the generating sequence corresponded to said row generator and the row weight.

Referred to table 6, each row in the table is the generating sequence corresponded to one row generator, each generating sequence corresponded to one row generator represents the number of column where element 1 locates in the first row of one row osubmatrixes (the range: 0~N−1, N=2688).

Because the row weight of the LDPC code in this embodiment is 7, 7 elements 1 locate in the first row of each row osubmatrixes, which is, 7 columns exists, the value of which is 1; furthermore, the submatrix in the parity check matrix in this embodiment is 112×112 matrix, and the number of check equations is 1344, so, the row number ρ of the submatrix in the parity check matrix ρ=1344/112=12, therefore, in this embodiment contain 84 digits, which is 12 rows×7 columns.

Table 6 contains several generating sequences comprising digits, the number of which is equal to the row weight. Taking the digits in each row of generating sequences in table 6 as the number of columns where element 1 locates in the first row of each corresponded row osubmatrixes. Which is, taking the digits in the first row of generating sequences in table 6 as the number of column where element 1 locates in the first row of the first row of sub-matrixes, taking the digits in the second row of generating sequences in table 6 as the number of column where element 1 locates in the second row of the first row of sub-matrixes, and so on, taking the digits in the final row of generating sequences in table 6 as the number of column where element 1 locates in the first row of the final row of sub-matrixes.

Specifically, evenly dividing table 6 into several generating sequences containing 7 digits, obtaining the elements in the first row of each row osubmatrixes in the parity check matrix on the basis of the obtained digits in each row of generating sequences, which is, the digits in each row illustrated in table 6.

For example, as shown in table 6, the first row of generating sequence is 417, 582, 1113, 1518, 2328, 2388 and 2544, which means the first row of the first row osubmatrixes in the parity check matrix, which is the value of the 418th, 583th, 1114th, 1519th, 2329th, 2389th and 2545th column in the first row in the parity check matrix is 1, other columns in the first row osubmatrixes are all 0;

The second row of generating sequence is 112, 343, 529, 607, 844, 1405 and 1861, which means the first row of the second row osubmatrixes in the parity check matrix, which is the value of the 418th, 583th, 1114th, 1519th, 2329th, 2389th, 2545th column in the 43th row in the parity check matrix is 1, other columns in the first row in the second row osubmatrixes are all 0, the value of elements in the first row of other row osubmatrixes, could be obtained as the above example, which is not described hereinafter.

Evenly dividing each row osubmatrixes, the value of the first row of which is determined, to c submatrixes in column; here, because the submatrix of the parity check matrix in this embodiment is 112×112 matrix, and the code length is 2688, each row has c=2688/112=24 submatrixes; after dividing, the parity check matrix is divided to 12(row)×24(column)=288 submatrixes, and the value of elements in the first row of each submatrix is determined.

Finally, obtaining the elements in the other rows of the submatrix, on the basis of the elements in the first row of each submatrix, by cyclic shift or directly addressing.

The detailed realization process is the same as step 102, which is not described hereinafter.

After the above steps, the parity check matrix H could be obtained. Because 12(row)×7(column)=84 digits exist in the generating sequence in table 1 in this embodiment. 84 substitution unit matrixes exist in the parity check matrix in this embodiment.

In this step, after obtaining the parity check matrix, carrying out the transforming such as rotating by any angle, row substitution, column substitution or position changing of submatrix.

In step 102, encoding said input data by the generating matrix G obtained from parity check matrix H, and transforming to LDPC codewords, obtaining the output data containing the parity check information.

Above is the illustrative process of the method for data transmission in the 5th embodiment in the present invention.

It could be got from the above embodiments that, the present invention uses the generating sequence corresponded to the row generator to represent the parity check matrix, and obtains the parity check matrix by cyclic shift or directly addressing of the row generator, and makes the parity check matrix take the minimum storage space.

Figure 6:
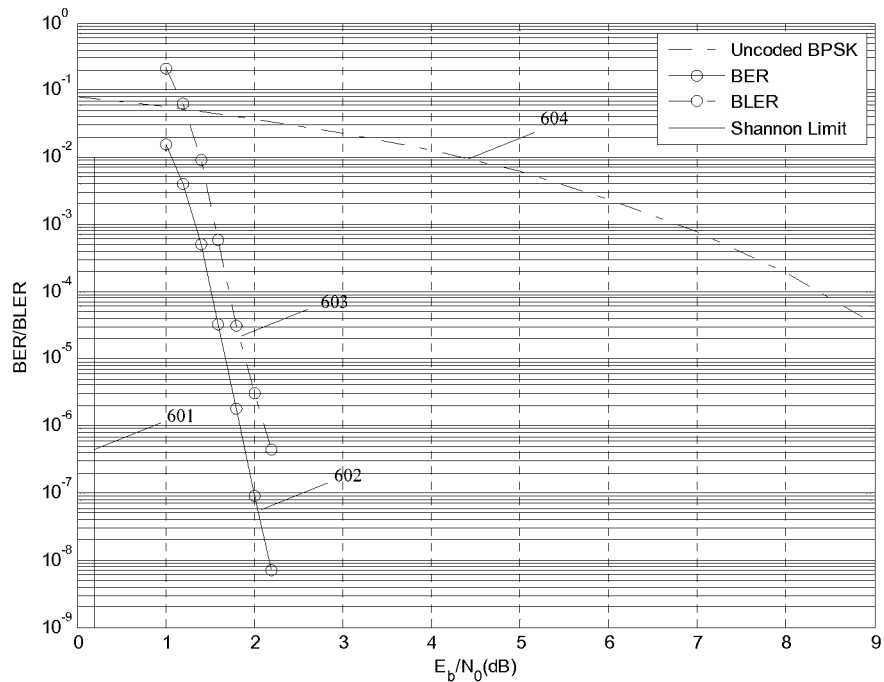
FIG. 6 illustrates the performance of (2688, 1344) LDPC code provided in the 5th embodiment in the present invention.

The following is the emulation comparison with the present technology, to show the performance of the (2688, 1344) irregular LDPC code provided in the 5th embodiment in the present invention. FIG. 6 is the illustration of the comparison of the BER/BLER performance of (2688, 1344) LDPC code, with BPSK modulation, on AWGN channel in the first embodiment, and the performance of Shannon Limit, without encoding BPSK. In the emulation, the decoding takes sum-product algorithm, with maximum 50 iterative time.

Referred to FIG. 6, wherein, straight row 601 represents the Shannon Limit;

Curve 602 represents the BER of the signal, which is encoded with (2688,1344) irregular LDPC code in the present invention, modulated by BPSK, then transmitted through AWGN channel, and decoded with the algorithm of Sum-Product Arithmetic(SPA).

Curve 603 represents the BLER of the signal, which is encoded with (2688,1344) irregular LDPC code in the present invention, modulated by BPSK, then transmitted through AWGN channel, and decoded with the algorithm of Sum-Product Arithmetic(SPA).

Curve 604 represents the BER performance of the signal, which has not been encoded, modulated by BPSK, and transmitted through AWGN channel.

The 6th Embodiment

This embodiment takes (2688, 1680) irregular LDPC code as an example. The code length N of the irregular LDPC code realized in this embodiment is 2688, the information bits length K is 1680, the row weight $\lambda=10$, the code rate $v=5/8$. It could be known from the relationship of the code rate, code length and the number of check equations that, the number of check equations M of the check matrix in this embodiment is M=2688−1680=1008. In this embodiment, the submatrix, the dimension of which is 112×112, as the minimum unit, is took as the example to illustrate the realization process of LDPC code.

The flowchart of the method in this embodiment is similar to the flowchart of the illustrative method shown in FIG. 1, referred to FIG. 1, the realization method of the LDPC code comprises the following steps:

In step 101, generating the parity check matrix on the basis of the generating sequence corresponded to the preserved row generator.

The row generator of (2688, 1680) LDPC code is illustrated in table 7, the (i+1) th row in the table is corresponded to the generating sequence of the (i+1) th row generator ($0 \le i < 9$).

TABLE 7

| |
| --- |
| 7 193 271 358 508 941 1069 1232 1830 2544 |
| 57 119 305 383 470 875 1482 1630 1710 1861 |
| 78 169 231 417 582 732 987 1456 1594 2427 |
| 35 190 281 343 529 607 1099 1405 1520 2085 |
| 24 147 302 393 641 806 1211 1680 2197 2278 |
| 104 136 259 414 1145 1323 1449 1744 2309 2646 |
| 98 216 248 371 526 943 1257 1904 2190 2502 |
| 41 210 328 360 729 1055 1142 1673 2382 2614 |
| 49 153 322 440 595 750 841 1404 1965 2080 |

First, determining the number of rows and columns in said constructing parity check matrix on the basis of preset code length, code rate and the dimension of submatrix, and dividing said parity check matrixes into arrays in the unit of submatrix.

The parity check matrix, the code length of which is 2688, the code rate is 5/8, contains 9 row generators totally, each row generator is corresponded to 9 row osubmatrixes, each row has 24 submatrixes. Thus, the parity check matrix, the code length of which is 2688, the code rate is 5/8, contains 9×24 submatrixes, the dimension of which is 112×112.

Then determining the elements in the first row of each submatrix on the basis of the generating sequence corresponded to said row generator and the row weight.

Referred to table 7, each row in the table 7 is the generating sequence corresponded to one row generator, each generating sequence corresponded to one row generator represents the number of column where element 1 locates in the first row of one row osubmatrixes (the range: 0~N−1, N=2688).

Because the row weight of the LDPC code in this embodiment is 10, 10 elements 1 locate in the first row of each row osubmatrixes, which is, 10 columns exists, the value of which is 1; furthermore, the submatrix in the parity check matrix in this embodiment is 112×112 matrix, and the number of check equations is 1008, so, the row number $\rho$ of the submatrix in the parity check matrix $\rho=1008/112=9$, therefore, in this embodiment contain 90 digits, which is 9 rows×10 columns.

Table 7 contains several generating sequences comprising digits, the number of which is equal to the row weight. Taking the digits in each row of generating sequences in table 7 as the number of columns where element 1 locates in the first row of each corresponded row osubmatrixes. Which is, taking the digits in the first row of generating sequences in table 7 as the number of column where element 1 locates in the first row of the first row osubmatrixes, taking the digits in the second row of generating sequences in table 7 as the number of column where element 1 locates in the second row of the first row osubmatrixes, and so on, taking the digits in the final row of generating sequences in table 7 as the number of column where element 1 locates in the first row of the final row osubmatrixes.

Specifically, evenly dividing table 7 into several generating sequences containing 10 digits, obtaining the elements in the first row of each row osubmatrixes in the parity check matrix on the basis of the obtained digits in each row of generating sequences, which is, the digits in each row illustrated in table 7.

For example, as shown in table 7, the first row of generating sequence is 7, 193, 271, 358, 508, 941, 1069, 1232, 1830 and 2544, which means the first row of the first row osubmatrixes in the parity check matrix, which is the value of the 8th, 194th, 272th, 359th, 509th, 942th, 1070th, 1233 th, 1831 th and 2545th column in the first row in the parity check matrix is 1, other columns in the first row osubmatrixes are all 0;

Evenly dividing each row osubmatrixes, the value of the first row of which is determined, to c submatrixes in column;

here, because the submatrix of the parity check matrix in this embodiment is 112×112 matrix, and the code length is 2688, each row has c=2688/112=24 submatrixes; after dividing, the parity check matrix is divided to 9(row)×24(column)=216 submatrixes, and the value of elements in the first row of each submatrix is determined.

Finally, obtaining the elements in the other rows of the submatrix, on the basis of the elements in the first row of each submatrix, by cyclic shift or directly addressing.

The detailed realization process is the same as step 101, which is not described hereinafter.

After the above steps, the parity check matrix H could be obtained. Because 9(row)×10(column)=90 digits exist in the generating sequence in table 1 in this embodiment. 90 substitution unit matrixes exist in the parity check matrix in this embodiment.

In this step, after obtaining the parity check matrix, carrying out the transforming such as rotating by any angle, row substitution, column substitution or position changing of submatrix.

In step 102, encoding said input data by the generating matrix G obtained from parity check matrix H, and transforming to LDPC codewords, obtaining the output data containing the parity check information.

Above is the illustrative process of the method for data transmission in the 6th embodiment in the present invention.

It could be got from the above embodiments that, the present invention uses the generating sequence corresponded to the row generator to represent the parity check matrix, and obtains the parity check matrix by cyclic shift or directly addressing of the row generator, and makes the parity check matrix take the minimum storage space.

Figure 7:
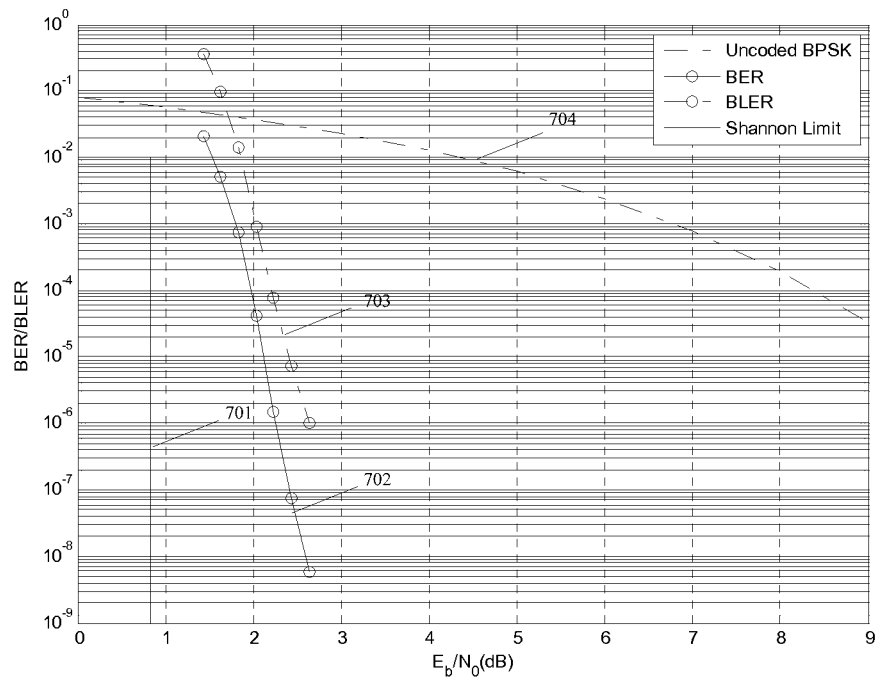
FIG. 7 illustrates the performance of (2688, 1680) LDPC code provided in the 6th embodiment in the present invention.

The following is the emulation comparison with the present technology, to show the performance of the (2688, 1680) irregular LDPC code provided in the 6th embodiment in the present invention. FIG. 7 is the illustration of the comparison of the BER/BLER performance of (2688,1680) LDPC code, with BPSK modulation, on AWGN channel in the 6th embodiment, and the performance of Shannon Limit, without encoding BPSK. In the emulation, the decoding takes sum-product algorithm, with maximum 50 iterative time.

Referred to FIG. 7, wherein, straight row 701 represents the Shannon Limit;

Curve 702 represents the BER of the signal, which is encoded with (2688,1680) irregular LDPC code in the present invention, modulated by BPSK, then transmitted through AWGN channel, and decoded with the algorithm of Sum-Product Arithmetic(SPA).

Curve 703 represents the BLER of the signal, which is encoded with (2688,1680) irregular LDPC code in the present invention, modulated by BPSK, then transmitted through AWGN channel, and decoded with the algorithm of Sum-Product Arithmetic(SPA).

Curve 704 represents the BER performance of the signal, which has not been encoded, modulated by BPSK, and transmitted through AWGN channel.

The 7th Embodiment

This embodiment takes (2688,2016) irregular LDPC code as an example. The code length N of the irregular LDPC code realized in this embodiment is 2688, the information bits length K is 2016, the row weight $\lambda=15$, the code rate $v=\frac{3}{4}$. It could be known from the relationship of the code rate, code length and the number of check equations that, the number of check equations M of the check matrix in this embodiment is M=2688−2016=672. In this embodiment, the submatrix, the dimension of which is 112×112, as the minimum unit, is took as the example to illustrate the realization process of LDPC code.

The flowchart of the method in this embodiment is similar to the flowchart of the illustrative method shown in FIG. 1, referred to FIG. 1, the realization method of the LDPC code comprises the following steps:

In step 101, generating the parity check matrix on the basis of the generating sequence corresponded to the preserved row generator.

The row generator of (2688,2016) LDPC code is illustrated in table 8, the (i+1) th row in the table is corresponded to the generating sequence of the (i+1) th row generator (0≤i<6).

TABLE 8

62 293 374 514 679 865 943 1030 1180 1257 1435 1613 1904 2203 2388
26 626 729 791 977 1055 1142 1292 1369 1547 1725 1853 1968 2016 2500
138 598 750 841 903 1089 1167 1404 1659 1785 1837 1965 2080 2310 2552
112 398 707 862 953 1015 1201 1279 1366 1516 1593 1897 1949 2306 2664
61 176 224 362 510 590 696 819 974 1065 1127 1478 1628 1705 2197
288 474 776 808 931 1086 1177 1239 1503 1740 1817 2121 2158 2390 2646

First, determining the number of row and columns in said constructing parity check matrix on the basis of preset code length, code rate and the dimension of submatrix, and dividing said parity check matrixes into arrays in the unit of submatrix.

The parity check matrix, the code length of which is 2688, the code rate is ¾, contains 6 row generators totally, each row generator is corresponded to 6 row osubmatrixes, each row submatrix has 24 submatrixes. Thus, the parity check matrix, the code length of which is 2688, the code rate is ¾, contains 6×24 submatrixes, the dimension of which is 112×112.

Then determining the elements in the first row of each submatrix on the basis of the generating sequence corresponded to said row generator and the row weight.

Referred to table 8, each row in the table 8 is the generating sequence corresponded to one row generator, each generating sequence corresponded to one row generator represents the number of column where element 1 locates in the first row of one row osubmatrixes (the range: 0~N−1, N=2688).

Because the row weight of the LDPC code in this embodiment is 15, 15 elements 1 locate in the first row of each row osubmatrixes, which is, 15 columns exists, the value of which is 1; furthermore, the submatrix in the parity check matrix in this embodiment is 112×112 matrix, and the number of check equations is 672, so, the row number ρ of the submatrix in the parity check matrix ρ=672/112=6, therefore, in this embodiment contain 90 digits, which is 6 rows×15 columns.

Table 8 contains several generating sequences comprising digits, the number of which is equal to the row weight. Taking the digits in each row of generating sequences in table 8 as the number of columns where element 1 locates in the first row of each corresponded row osubmatrixes. Which is, taking the digits in the first row of generating sequences in table 8 as the number of column where element 1 locates in the first row of the first row osubmatrixes, taking the digits in the second row of generating sequences in table 8 as the number of column where element 1 locates in the second row of the first row osubmatrixes, and so on, taking the digits in the final row of generating sequences in table 8 as the number of column where element 1 locates in the first row of the final row osubmatrixes.

Specifically, evenly dividing table 8 into several generating sequences containing 15 digits, obtaining the elements in the first row of each row osubmatrixes in the parity check matrix on the basis of the obtained digits in each row of generating sequences, which is, the digits in each row illustrated in table 8.

For example, as shown in table 8, the first row of generating sequence is 62, 293, 374, 514, 679, 865, 943, 1030, 1180, 1257, 1435, 1613, 1904, 2203 and 2388, which means the first row of the first row osubmatrixes in the parity check matrix, which is the value of the 63th, 294th, 375th, 515th, 680th, 866th, 944th, 1031th, 1181th, 1258th, 1436th, 1614th, 1905th, 2204 th and 2389th column in the first row in the parity check matrix is 1, other columns in the first row osubmatrixes are all 0;

Evenly dividing each row osubmatrixes, the value of the first row of which is determined, to c submatrixes in column; here, because the submatrix of the parity check matrix in this embodiment is 112×112 matrix, and the code length is 2688, each row has c=2688/112=24 submatrixes; after dividing, the parity check matrix is divided to 6(row)×24(column)=144 submatrixes, and the value of elements in the first row of each submatrix is determined.

Finally, obtaining the elements in the other rows of the submatrix, on the basis of the elements in the first row of each submatrix, by cyclic shift or directly addressing.

The detailed realization process is the same as step 101, which is not described hereinafter.

After the above steps, the parity check matrix H could be obtained. Because 6(row)×15(column)=90 digits exist in the generating sequence in table 1 in this embodiment. 90 substitution unit matrixes exist in the parity check matrix in this embodiment.

In this step, after obtaining the parity check matrix, carrying out the transforming such as rotating by any angle, row substitution, column substitution or position changing of submatrix.

In step 102, encoding said input data by the generating matrix G obtained from parity check matrix H, and transforming to LDPC codewords, obtaining the output data containing the parity check information.

Above is the illustrative process of the method for data transmission in the 7th embodiment in the present invention.

It could be got from the above embodiments that, the present invention uses the generating sequence corresponded to the row generator to represent the parity check matrix, and obtains the parity check matrix by cyclic shift or directly addressing of the row generator, and makes the parity check matrix take the minimum storage space.

Figure 8:
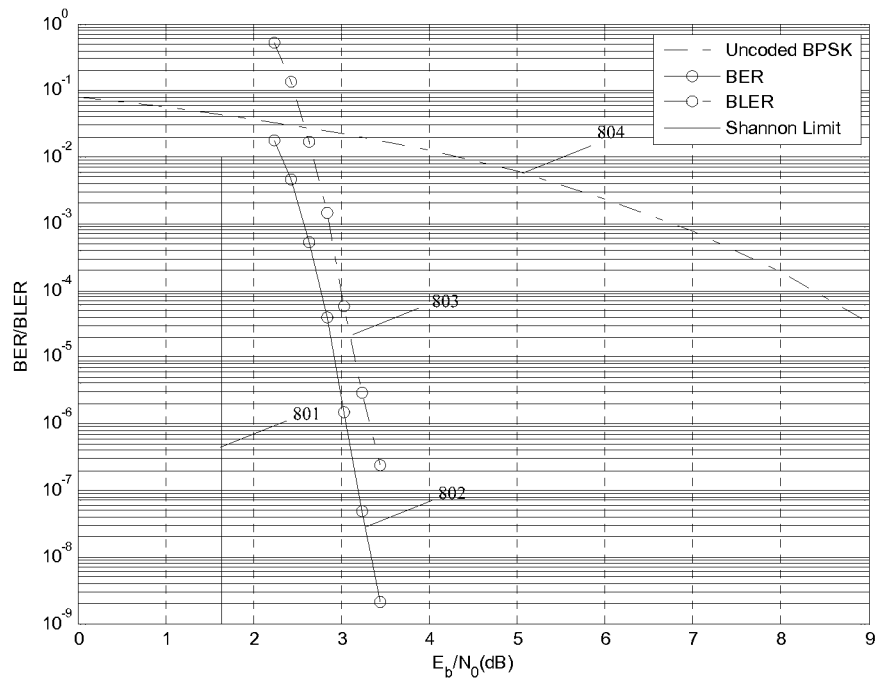
FIG. 8 illustrates the performance of (2688, 2016) LDPC code provided in the 7th embodiment in the present invention.

The following is the emulation comparison with the present technology, to show the performance of the (2688, 2016) irregular LDPC code provided in the 7th embodiment in the present invention. FIG. 8 is the illustration of the comparison of the BER/BLER performance of (2688,2016) LDPC code, with BPSK modulation, on AWGN channel in the 7th embodiment, and the performance of Shannon Limit, without encoding BPSK. In the emulation, the decoding takes sum-product algorithm, with maximum 50 iterative time.

Referred to FIG. 8, wherein, straight row 801 represents the Shannon Limit;

Curve 802 represents the BER of the signal, which is encoded with (2688,2016) irregular LDPC code in the present invention, modulated by BPSK, then transmitted through AWGN channel, and decoded with the algorithm of Sum-Product Arithmetic(SPA).

Curve 803 represents the BLER of the signal, which is encoded with (2688,2016) irregular LDPC code in the present invention, modulated by BPSK, then transmitted through AWGN channel, and decoded with the algorithm of Sum-Product Arithmetic(SPA).

Curve 804 represents the BER performance of the signal, which has not been encoded, modulated by BPSK, and transmitted through AWGN channel.

The 8th Embodiment

This embodiment takes (2688, 2240) irregular LDPC code as an example. The code length N of the irregular LDPC code realized in this embodiment is 2688, the information bits length K is 2240, the row weight $\lambda=28$, the code rate $v=7/8$. It could be known from the relationship of the code rate, code length and the number of check equations that, the number of check equations M of the check matrix in this embodiment is M=2688−2240=448. In this embodiment, the submatrix, the dimension of which is 112×112, as the minimum unit, is took as the example to illustrate the realization process of LDPC code.

The flowchart of the method in this embodiment is similar to the flowchart of the illustrative method shown in FIG. 1, referred to FIG. 1, the realization method of the LDPC code comprises the following steps:

In step 101, generating the parity check matrix on the basis of the generating sequence corresponded to the preserved row generator.

The row generator of (2688, 2240) LDPC code is illustrated in table 9, the (i+1) th row in the table is corresponded to the generating sequence of the (i+1) th row generator ($0 \le i < 4$).

TABLE 9

7 193 271 358 508 585 763 889 941 1069 1184 1232 1370 1518 1598
1749 1830 1970 2086 2203 2544
57 119 305 383 470 620 697 875 1001 1053 1181 1296 1344 1482
1630 1861 1942 2198 2315 2440 2500
78 169 231 417 495 582 732 809 987 1113 1165 1293 1408 1456
1594 1742 1822 2054 2194 2310 2612
35 190 281 343 529 607 694 844 921 1099 1225 1277 1405 1520 1568
1706 1934 2085 2306 2422 2664

First, determining the number rows and columns in said constructing parity check matrix on the basis of preset code length, code rate and the dimension of submatrix, and dividing said parity check matrixes into arrays in the unit of submatrix.

The parity check matrix, the code length of which is 2688, the code rate is 7/8, contains 4 row generators totally, each row generator is corresponded to one row osubmatrixes, each row has 24 submatrixes. Thus, the parity check matrix, the code length of which is 2688, the code rate is 7/8, contains 4×24 submatrixes, the dimension of which is 112×112.

Then determining the elements in the first row of each submatrix on the basis of the generating sequence corresponded to said row generator and the row weight.

Referred to table 9, each row in the table is the generating sequence corresponded to one row generator, each generating sequence corresponded to one row generator represents the number of column where element 1 locates in the first row of one row osubmatrixes (the range: 0~N−1, N=2688).

Because the row weight of the LDPC code in this embodiment is 21, 21 elements 1 locate in the first row of each row osubmatrixes, which is, 21 columns exists, the value of which is 1; furthermore, the submatrix in the parity check matrix in this embodiment is 112×112 matrix, and the number of check equations is 448, so, the row number ρ of the submatrix in the parity check matrix ρ=448/112=4, therefore, in this embodiment contain 84 digits, which is 4 rows×21 columns.

Table 9 contains several generating sequences comprising digits, the number of which is equal to the row weight. Taking the digits in each row of generating sequences in table 9 as the number of columns where element 1 locates in the first row of each corresponded row osubmatrixes. Which is, taking the digits in the first row of generating sequences in table 9 as the number of column where element 1 locates in the first row of the first row osubmatrixes, taking the digits in the second row of generating sequences in table 9 as the number of column where element 1 locates in the second row of the first row osubmatrixes, and so on, taking the digits in the final row of generating sequences in table 9 as the number of column where element 1 locates in the first row of the final row osubmatrixes.

Specifically, evenly dividing table 9 into several generating sequences containing 21 digits, obtaining the elements in the first row of each row osubmatrixes in the parity check matrix on the basis of the obtained digits in each row of generating sequences, which is, the digits in each row illustrated in table 9.

For example, as shown in table 9, the first row of generating sequence is 7, 193, 271, 358, 508, 585, 763, 889, 941, 1069, 1184, 1232, 1370, 1518, 1598, 1749, 1830, 1970, 2086, 2203 and 2544, which means the first row of the first row osubmatrixes in the parity check matrix, which is the value of the 8th, 194th, 272th, 359th, 509th, 586th, 764th, 890th, 942th, 1070th, 1185th, 1233th, 1371th, 1519th, 1599th, 1750th, 1831th, 1971th, 2087th, 2204th and 2545th column in the first row in the parity check matrix is 1, other columns in the first row osubmatrixes are all 0;

Evenly dividing each row osubmatrixes, the value of the first row of which is determined, to c submatrixes in column; here, because the submatrix of the parity check matrix in this embodiment is 112×112 matrix, and the code length is 2688, each row has c=2688/112=24 submatrixes; after dividing, the parity check matrix is divided to 4(row)×21(column)=84 submatrixes, and the value of elements in the first row of each submatrix is determined.

Finally, obtaining the elements in the other rows of the submatrix, on the basis of the elements in the first row of each submatrix, by cyclic shift or directly addressing.

The detailed realization process is the same as step 101, which is not described hereinafter.

After the above steps, the parity check matrix H could be obtained. Because 4(row)×21(column)=84 digits exist in the generating sequence in table 1 in this embodiment. 112 substitution unit matrixes exist in the parity check matrix in this embodiment.

In this step, after obtaining the parity check matrix, carrying out the transforming such as rotating by any angle, row substitution, column substitution or position changing of submatrix.

In step 102, encoding said input data by the generating matrix G obtained from parity check matrix H, and transforming to LDPC codewords, obtaining the output data containing the parity check information.

Above is the illustrative process of the method for data transmission in the 8th embodiment in the present invention.

It could be got from the above embodiments that, the present invention uses the generating sequence corresponded to the row generator to represent the parity check matrix, and obtains the parity check matrix by cyclic shift or directly addressing of the row generator, and makes the parity check matrix take the minimum storage space.

Figure 9:
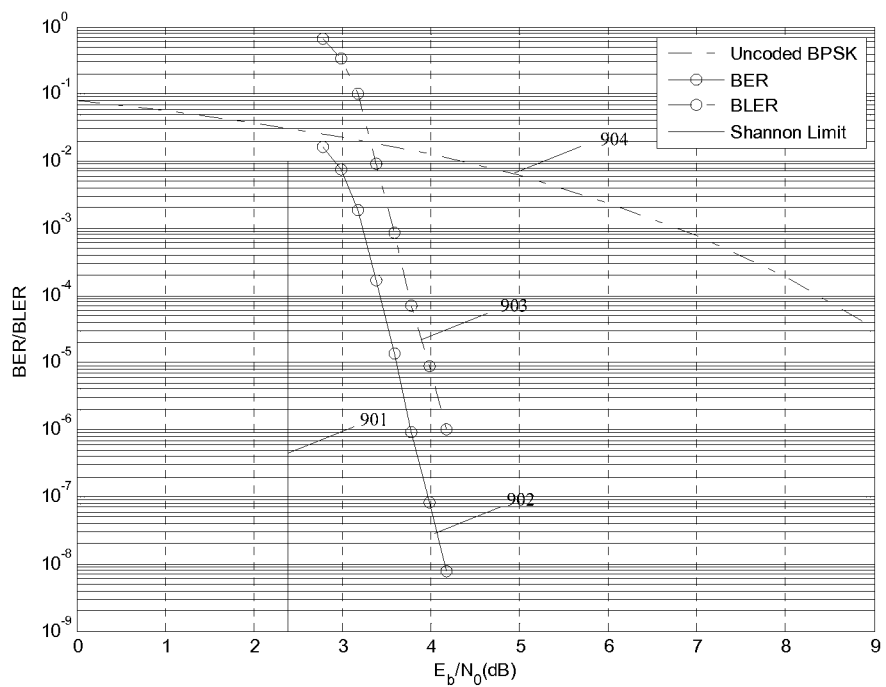
FIG. 9 illustrates the performance of (2688, 2240) LDPC code provided in the 8th embodiment in the present invention.

The following is the emulation comparison with the present technology, to show the performance of the (2688, 2240) irregular LDPC code provided in the 8th embodiment in the present invention. FIG. 9 is the illustration of the comparison of the BER/BLER performance of (2688, 2240) LDPC code, with BPSK modulation, on AWGN channel in the 8th embodiment, and the performance of Shannon Limit, without encoding BPSK. In the emulation, the decoding takes sum-product algorithm, with maximum 50 iterative time.

Referred to FIG. 9, wherein, straight row 901 represents the Shannon Limit;

Curve 902 represents the BER of the signal, which is encoded with (2688,2240) irregular LDPC code in the present invention, modulated by BPSK, then transmitted through AWGN channel, and decoded with the algorithm of Sum-Product Arithmetic(SPA).

Curve 903 represents the BLER of the signal, which is encoded with (2688,2240) irregular LDPC code in the present invention, modulated by BPSK, then transmitted through AWGN channel, and decoded with the algorithm of Sum-Product Arithmetic(SPA).

Curve 904 represents the BER performance of the signal, which has not been encoded, modulated by BPSK, and transmitted through AWGN channel.

The 9th Embodiment

This embodiment takes (5376,2688) irregular LDPC code as an example. The code length N of the irregular LDPC code realized in this embodiment is 5376, the information bits length K is 2688, the row weight λ=7, the code rate v=½. It could be known from the relationship of the code rate, code length and the number of check equations that, the number of check equations M of the check matrix in this embodiment is M=5376−2688=2688. In this embodiment, the submatrix, the dimension of which is 112×112, as the minimum unit, is took as the example to illustrate the realization process of LDPC code.

The flowchart of the method in this embodiment is similar to the flowchart of the illustrative method shown in FIG. 1, referred to FIG. 1, the realization method of the LDPC code comprises the following steps:

In step 101, generating the parity check matrix on the basis of the generating sequence corresponded to the preserved row generator.

The row generator of (5376,2688) LDPC code is illustrated in table 10, the (i+1) th row in the table is corresponded to the generating sequence of the (i+1) th row generator (0≤i<24).

TABLE 10

| |
| --- |
| 147 281 1109 1381 2089 4658 5232 |
| 98 607 826 1108 1813 2024 4398 |
| 1220 1333 1605 2406 3031 4661 4998 |
| 248 526 1445 1906 2238 2248 4854 |
| 880 968 1092 1162 1557 2149 3494 |
| 322 718 827 992 1080 1274 4317 |
| 434 1316 1668 3048 3214 3305 5109 |
| 377 765 815 1216 2354 3417 3743 |
| 1163 1610 1686 1892 2005 2466 3591 |
| 658 1039 1166 1275 2117 2808 3967 |
| 1101 1151 2501 2682 2985 4079 4571 |
| 796 1019 1213 2341 2613 3083 3865 |
| 502 706 908 1325 1776 2802 4795 |
| 37 818 991 1020 1487 2933 5213 |
| 614 930 1300 1835 3682 4764 5325 |
| 357 558 946 1244 2394 2676 4953 |
| 751 886 1356 1773 1823 2059 2949 |
| 100 764 1468 2336 3321 4168 4537 |
| 213 876 975 1378 1580 2730 3433 |

TABLE 10-continued 688 835 988 1692 2159 2560 2772
783 1199 1334 2760 3750 4081 4472
912 1311 1504 1916 2884 3952 4193
699 1024 1171 1999 2196 5097 5345
184 771 3221 3474 3816 4315 4840

First, determining the number of rows and columns in said constructing parity check matrix on the basis of preset code length, code rate and the dimension of submatrix, and dividing said parity check matrixes into arrays in the unit of submatrix.

The parity check matrix, the code length of which is 5376, the code rate is ½, contains 24 row generators totally, each row generator is corresponded to 24 row submatrixes, each row has 48 submatrixes. Thus, the parity check matrix, the code length of which is 5376, the code rate is ½, contains 24×48 submatrixes, the dimension of which is 112×112.

Then determining the elements in the first row of each submatrix on the basis of the generating sequence corresponded to said row generator and the row weight.

Referred to table 10, each row in the table is the generating sequence corresponded to one row generator, each generating sequence corresponded to one row generator represents the number of column where element 1 locates in the first row of one row osubmatrixes (the range: 0~N−1, N=5376).

Because the row weight of the LDPC code in this embodiment is 7, 7 elements 1 locate in the first row of each row osubmatrixes, which is, 7 columns exists, the value of which is 1; furthermore, the submatrix in the parity check matrix in this embodiment is 112×112 matrix, and the number of check equations is 2688, so, the row number ρ of the submatrix in the parity check matrix ρ=2688/112=24, therefore, in this embodiment contain 1152 digits, which is 24 rows×48 columns.

Table 10 contains several generating sequences comprising digits, the number of which is equal to the row weight. Taking the digits in each row of generating sequences in table 10 as the number of columns where element 1 locates in the first row of each corresponded row osubmatrixes. Which is, taking the digits in the first row of generating sequences in table 10 as the number of column where element 1 locates in the first row of the first row osubmatrixes, taking the digits in the second row of generating sequences in table 10 as the number of column where element 1 locates in the second row of the first row osubmatrixes, and so on, taking the digits in the final row of generating sequences in table 10 as the number of column where element 1 locates in the first row of the final row osubmatrixes.

Specifically, evenly dividing table 10 into several generating sequences containing 7 digits, obtaining the elements in the first row of each row osubmatrixes in the parity check matrix on the basis of the obtained digits in each row of generating sequences, which is, the digits in each row illustrated in table 10.

For example, as shown in table 10, the first row of generating sequence is 147, 281, 1109, 1381, 2089, 4658 and 5232, which means the first row of the first row osubmatrixes in the parity check matrix, which is the value of the 148th, 282th, 1110th, 1382th, 2090th, 4659th and 5233 th column in the first row in the parity check matrix is 1, other columns in the first row osubmatrixes are all 0;

Evenly dividing each row osubmatrixes, the value of the first row of which is determined, to c submatrixes in column; here, because the submatrix of the parity check matrix in this embodiment is 112×112 matrix, and the code length is 5376, each row has c=5376/112=48 submatrixes; after dividing, the parity check matrix is divided to 24(row)×48(column)=1152 submatrixes, and the value of elements in the first row of each submatrix is determined.

Finally, obtaining the elements in the other rows of the submatrix, on the basis of the elements in the first row of each submatrix, by cyclic shift or directly addressing.

The detailed realization process is the same as step 101, which is not described hereinafter.

After the above steps, the parity check matrix H could be obtained. Because 24(row)×7(column)=168 digits exist in the generating sequence in table 1 in this embodiment. 168 substitution unit matrixes exist in the parity check matrix in this embodiment.

In this step, after obtaining the parity check matrix, carrying out the transforming such as rotating by any angle, row substitution, column substitution or position changing of submatrix.

In step 102, encoding said input data by the generating matrix G obtained from parity check matrix H, and transforming to LDPC codewords, obtaining the output data containing the parity check information.

Above is the illustrative process of the method for data transmission in the 9th embodiment in the present invention.

It could be got from the above embodiments that, the present invention uses the generating sequence corresponded to the row generator to represent the parity check matrix, and obtains the parity check matrix by cyclic shift or directly addressing of the row generator, and makes the parity check matrix take the minimum storage space.

Figure 10:
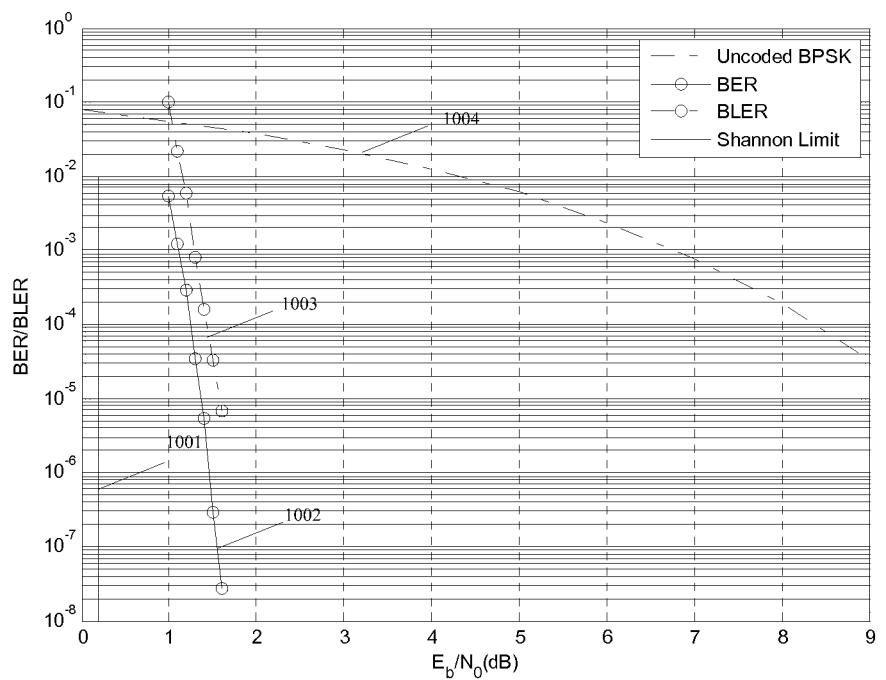
FIG. 10 illustrates the performance of (5376, 2688) LDPC code provided in the 9th embodiment in the present invention.

The following is the emulation comparison with the present technology, to show the performance of the (5376, 2688) irregular LDPC code provided in the 9th embodiment in the present invention. FIG. 10 is the illustration of the comparison of the BER/BLER performance of (5376,2688) LDPC code, with BPSK modulation, on AWGN channel in the 9th embodiment, and the performance of Shannon Limit, without encoding BPSK. In the emulation, the decoding takes sum-product algorithm, with maximum 50 iterative time.

Referred to FIG. 10, wherein, straight row 1001 represents the Shannon Limit;

Curve 1002 represents the BER of the signal, which is encoded with (5376,2688) irregular LDPC code in the present invention, modulated by BPSK, then transmitted through AWGN channel, and decoded with the algorithm of Sum-Product Arithmetic(SPA).

Curve 1003 represents the BLER of the signal, which is encoded with (5376,2688) irregular LDPC code in the present invention, modulated by BPSK, then transmitted through AWGN channel, and decoded with the algorithm of Sum-Product Arithmetic(SPA).

Curve 1004 represents the BER performance of the signal, which has not been encoded, modulated by BPSK, and transmitted through AWGN channel.

The 10th Embodiment

This embodiment takes (5376,3360) irregular LDPC code as an example. The code length N of the irregular LDPC code realized in this embodiment is 5376, the information bits length K is 3360, the row weight λ=10, the code rate ν=⅝. It could be known from the relationship of the code rate, code length and the number of check equations that, the number of check equations M of the check matrix in this embodiment is M=5376−3360=2016. In this embodiment, the submatrix, the dimension of which is 112×112, as the minimum unit, is took as the example to illustrate the realization process of LDPC code.

The flowchart of the method in this embodiment is similar to the flowchart of the illustrative method shown in FIG. 1, referred to FIG. 1, the realization method of the LDPC code comprises the following steps:

In step 101, generating the parity check matrix on the basis of the generating sequence corresponded to the preserved row generator.

The row generator of (5376,3360) LDPC code is illustrated in table 11, the (i+1)th row in the table is corresponded to the generating sequence of the (i+1) th row generator (0≤i<18).

TABLE 11

| |
|---|
| 60 773 981 1045 1226 1234 1576 1846 2969 4437 |
| 22 566 772 1093 2048 2289 3329 3984 4318 5344 |
| 315 408 532 678 1977 2070 2505 2792 3494 4742 |
| 432 520 714 790 996 1570 2936 3214 3305 3367 |
| 826 1221 1429 1493 1674 2024 2201 3016 4654 5222 |
| 382 491 744 868 938 1786 2313 4137 4189 4997 |
| 119 367 603 1126 1445 1470 2238 2747 3395 4301 |
| 479 715 968 1444 1557 1765 2350 3234 3830 4413 |
| 347 1080 1204 1877 1941 2130 2472 2832 4653 4816 |
| 459 653 703 830 939 1462 3662 3703 4585 4765 |
| 302 571 942 1216 1428 1918 3056 3195 3815 5040 |
| 431 628 877 1054 1163 1328 1686 2458 3307 5290 |
| 210 370 543 572 740 1039 1166 2389 2570 4973 |
| 153 386 655 907 1101 2682 2821 3998 4907 5085 |
| 498 796 1213 1263 1664 2613 3531 3625 4110 4527 |
| 438 879 908 1076 1864 2453 2661 3045 4222 5257 |
| 550 608 818 1020 1188 1243 2773 2837 3368 3526 |
| 8 527 662 720 834 930 1103 3130 3616 3745 |

First, determining the number rows and columns in said constructing parity check matrix on the basis of preset code length, code rate and the dimension of submatrix, and dividing said parity check matrixes into arrays in the unit of submatrix.

The parity check matrix, the code length of which is 5376, the code rate is ⅝, contains 18 row generators totally, each row generator is corresponded to 24 row osubmatrixes, each 24 row osubmatrixes has 48 submatrixes. Thus, the parity check matrix, the code length of which is 5376, the code rate is ⅝, contains 18×48 submatrixes, the dimension of which is 112×112.

Then determining the elements in the first row of each submatrix on the basis of the generating sequence corresponded to said row generator and the row weight.

Referred to table 11, each row in the table is the generating sequence corresponded to one row generator, each generating sequence corresponded to one row generator represents the number of column where element 1 locates in the first row of one row osubmatrixes (the range: 0~N−1, N=5376).

Because the row weight of the LDPC code in this embodiment is 10, 10 elements 1 locate in the first row of each row osubmatrixes, which is, 10 columns exists, the value of which is 1; furthermore, the submatrix in the parity check matrix in this embodiment is 112×112 matrix, and the number of check equations is 2016, so, the row number ρ of the submatrix in the parity check matrix ρ=2016/42=18, therefore, in this embodiment contain 180 digits, which is 18 rows×10 columns.

Table 11 contains several generating sequences comprising digits, the number of which is equal to the row weight. Taking the digits in each row of generating sequences in table 11 as the number of columns where element 1 locates in the first row of each corresponded row osubmatrixes. Which is, taking the digits in the first row of generating sequences in table 11 as the number of column where element 1 locates in the first row of the first row osubmatrixes, taking the digits in the second row of generating sequences in table 11 as the number of column where element 1 locates in the second row of the first row osubmatrixes, and so on, taking the digits in the final row of generating sequences in table 11 as the number of column where element 1 locates in the first row of the final row osubmatrixes.

Specifically, evenly dividing table 11 into several generating sequences containing 10 digits, obtaining the elements in the first row of each row osubmatrixes in the parity check matrix on the basis of the obtained digits in each row of generating sequences, which is, the digits in each row illustrated in table 11.

For example, as shown in table 11, the first row of generating sequence is 60, 773, 981, 1045, 1226, 1234, 1576, 1846, 2969 and 4437, which means the first row of the first row osubmatrixes in the parity check matrix, which is the value of the 61th, 774th, 982th, 1046th, 1227th, 1235th, 1577th, 1847th, 2970th and 4438th column in the first row in the parity check matrix is 1, other columns in the first row osubmatrixes are all 0;

Evenly dividing each row osubmatrixes, the value of the first row of which is determined, to c submatrixes in column; here, because the submatrix of the parity check matrix in this embodiment is 112×112 matrix, and the code length is 5376, each row has c=5376/112=48 submatrixes; after dividing, the parity check matrix is divided to 18(row)×48(column)=846 submatrixes, and the value of elements in the first row of each submatrix is determined.

Finally, obtaining the elements in the other rows of the submatrix, on the basis of the elements in the first row of each submatrix, by cyclic shift or directly addressing.

The detailed realization process is the same as step 101, which is not described hereinafter.

After the above steps, the parity check matrix H could be obtained. Because 18(row)×10(column)=180 digits exist in the generating sequence in table 1 in this embodiment. 180 substitution unit matrixes exist in the parity check matrix in this embodiment.

In this step, after obtaining the parity check matrix, carrying out the transforming such as rotating by any angle, row substitution, column substitution or position changing of submatrix.

In step 102, encoding said input data by the generating matrix G obtained from parity check matrix H, and transforming to LDPC codewords, obtaining the output data containing the parity check information.

Above is the illustrative process of the method for data transmission in the 10th embodiment in the present invention.

It could be got from the above embodiments that, the present invention uses the generating sequence corresponded to the column generator to represent the parity check matrix, and obtains the parity check matrix by cyclic shift or directly addressing of the row generator, and makes the parity check matrix take the minimum storage space.

Figure 11:
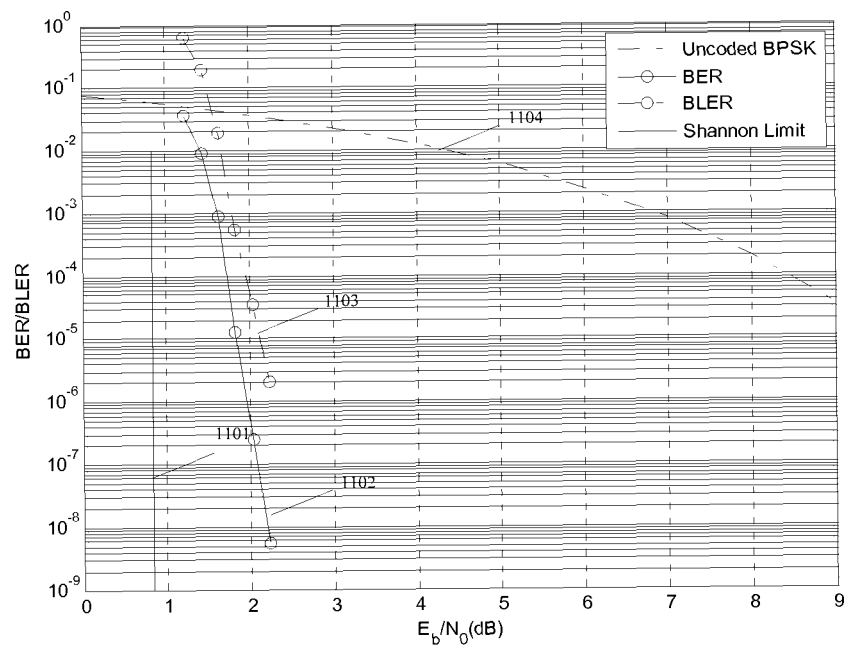
FIG. 11 illustrates the performance of (5376, 3360) LDPC code provided in the 10th embodiment in the present invention.

The following is the emulation comparison with the present technology, to show the performance of the (5376, 3360) irregular LDPC code provided in the 10th embodiment in the present invention. FIG. 11 is the illustration of the comparison of the BER/BLER performance of (5376,3360) LDPC code, with BPSK modulation, on AWGN channel in the 10th embodiment, and the performance of Shannon Limit, without encoding BPSK. In the emulation, the decoding takes sum-product algorithm, with maximum 50 iterative time.

Referred to FIG. 11, wherein, straight row 1101 represents the Shannon Limit;

Curve 1102 represents the BER of the signal, which is encoded with (5376,3360) irregular LDPC code in the present invention, modulated by BPSK, then transmitted through AWGN channel, and decoded with the algorithm of Sum-Product Arithmetic(SPA).

Curve 1103 represents the BLER of the signal, which is encoded with (5376,3360) irregular LDPC code in the present invention, modulated by BPSK, then transmitted through AWGN channel, and decoded with the algorithm of Sum-Product Arithmetic(SPA).

Curve 1104 represents the BER performance of the signal, which has not been encoded, modulated by BPSK, and transmitted through AWGN channel.

The 11th Embodiment

This embodiment takes (5376, 4032) irregular LDPC code as an example. The code length N of the irregular LDPC code realized in this embodiment is 5376, the information bits length K is 4032, the row weight A=15, the code rate v=¾. It could be known from the relationship of the code rate, code length and the number of check equations that, the number of check equations M of the check matrix in this embodiment is M=5376−4032=1344. In this embodiment, the submatrix, the dimension of which is 42×42, as the minimum unit, is took as the example to illustrate the realization process of LDPC code.

The flowchart of the method in this embodiment is similar to the flowchart of the illustrative method shown in FIG. 1, referred to FIG. 1, the realization method of the LDPC code comprises the following steps:

In step 101, generating the parity check matrix on the basis of the generating sequence corresponded to the preserved row generator.

The row generator of (5376,4032) LDPC code is illustrated in table 12, the (i+1) th row in the table is corresponded to the generating sequence of the (i+1) th row generator (0≤i<12).

TABLE 12

| |
| --- |
| 0 181 342 661 686 869 933 1963 2919 3105 3183 3270 4398 4518 5076 |
| 64 308 378 660 773 1365 2177 2450 2568 2723 2878 3532 4144 4770 5344 |
| 296 490 566 772 885 1477 1678 1688 2562 2680 3721 4077 4256 4661 5240 |
| 320 532 602 884 997 1022 1450 1458 1589 1790 1800 3193 4011 4205 4854 |
| 267 432 644 714 790 1134 1317 1381 1562 1902 2089 3367 3868 4506 4966 |
| 379 544 632 826 902 1246 1674 1682 2014 2294 2729 2898 3016 3048 4846 |
| 382 491 656 744 868 1014 2126 2136 2313 2406 2496 3438 3942 4361 4730 |
| 60 157 317 367 494 768 856 1050 1126 1906 2608 3641 3889 4054 4990 |
| 235 429 479 606 715 1162 1238 1444 1557 1582 1765 3352 3507 3662 5102 |
| 292 347 541 827 1080 1204 1274 2742 2832 3464 3774 3927 4316 5214 5294 |
| 236 459 703 939 1806 2053 2234 2242 3083 3185 3576 3608 3886 4428 4697 |
| 319 348 516 571 765 815 1893 1918 2354 2686 2966 3297 3720 4089 4225 |

First, determining the number of rows and columns in said constructing parity check matrix on the basis of preset code length, code rate and the dimension of submatrix, and dividing said parity check matrixes into arrays in the unit of submatrix.

The parity check matrix, the code length of which is 5376, the code rate is ¾, contains 12 row generators totally, each row generator is corresponded to one row osubmatrixes, each row has 48 submatrixes. Thus, the parity check matrix, the code length of which is 5376, the code rate is ¾, contains 12×48 submatrixes, the dimension of which is 112×112.

Then determining the elements in the first row of each submatrix on the basis of the generating sequence corresponded to said row generator and the row weight.

Referred to table 12, each row in the table is the generating sequence corresponded to one row generator, each generating sequence corresponded to one row generator represents the number of column where element 1 locates in the first row of one row osubmatrixes (the range: 0~N−1, N=5376).

Because the row weight of the LDPC code in this embodiment is 15, 15 elements 1 locate in the first row of each row osubmatrixes, which is, 15 columns exists, the value of which is 1; furthermore, the submatrix in the parity check matrix in this embodiment is 112×112 matrix, and the number of check equations is 1344, so, the row number ρ of the submatrix in the parity check matrix ρ=1344/112=12, therefore, in this embodiment contain 180 digits, which is 12 rows×15 columns.

Table 12 contains several generating sequences comprising digits, the number of which is equal to the row weight. Taking the digits in each row of generating sequences in table 12 as the number of columns where element 1 locates in the first row of each corresponded row osubmatrixes. Which is, taking the digits in the first row of generating sequences in table 12 as the number of column where element 1 locates in the first row of the first row osubmatrixes, taking the digits in the second row of generating sequences in table 12 as the number of column where element 1 locates in the second row of the first row osubmatrixes, and so on, taking the digits in the final row of generating sequences in table 12 as the number of column where element 1 locates in the first row of the final row osubmatrixes.

Specifically, evenly dividing table 12 into several generating sequences containing 15 digits, obtaining the elements in the first row of each row osubmatrixes in the parity check matrix on the basis of the obtained digits in each row of generating sequences, which is, the digits in each row illustrated in table 12.

For example, as shown in table 12, the first row of generating sequence is 0, 181, 342, 661, 686, 869, 933, 1963, 2919, 3105, 3183, 3270, 4398, 4518 and 5076, which means the first row of the first row osubmatrixes in the parity check matrix, which is the value of the 1th, 182th, 343th, 662th, 687th, 870th, 934th, 1964th, 2920th, 3106th, 3184th, 3271th, 4399th, 4519th and 5077th column in the first row in the parity check matrix is 1, other columns in the first row osubmatrixes are all 0;

Evenly dividing each row osubmatrixes, the value of the first row of which is determined, to c submatrixes in column; here, because the submatrix of the parity check matrix in this embodiment is 112×112 matrix, and the code length is 5376, each row has c=5376/112=48 submatrixes; after dividing, the parity check matrix is divided to 12(row)×48(column)=576 submatrixes, and the value of elements in the first row of each submatrix is determined.

Finally, obtaining the elements in the other rows of the submatrix, on the basis of the elements in the first row of each submatrix, by cyclic shift or directly addressing.

The detailed realization process is the same as step 101, which is not described hereinafter.

After the above steps, the parity check matrix H could be obtained. Because 12(row)×15(column)=180 digits exist in the generating sequence in table 1 in this embodiment. 180 substitution unit matrixes exist in the parity check matrix in this embodiment.

In this step, after obtaining the parity check matrix, carrying out the transforming such as rotating by any angle, row substitution, column substitution or position changing of submatrix.

In step 102, encoding said input data by the generating matrix G obtained from parity check matrix H, and transforming to LDPC codewords, obtaining the output data containing the parity check information.

Above is the illustrative process of the method for data transmission in the 11th embodiment in the present invention.

It could be got from the above embodiments that, the present invention uses the generating sequence corresponded to the row generator to represent the parity check matrix, and obtains the parity check matrix by cyclic shift or directly addressing of the row generator, and makes the parity check matrix take the minimum storage space.

Figure 12:
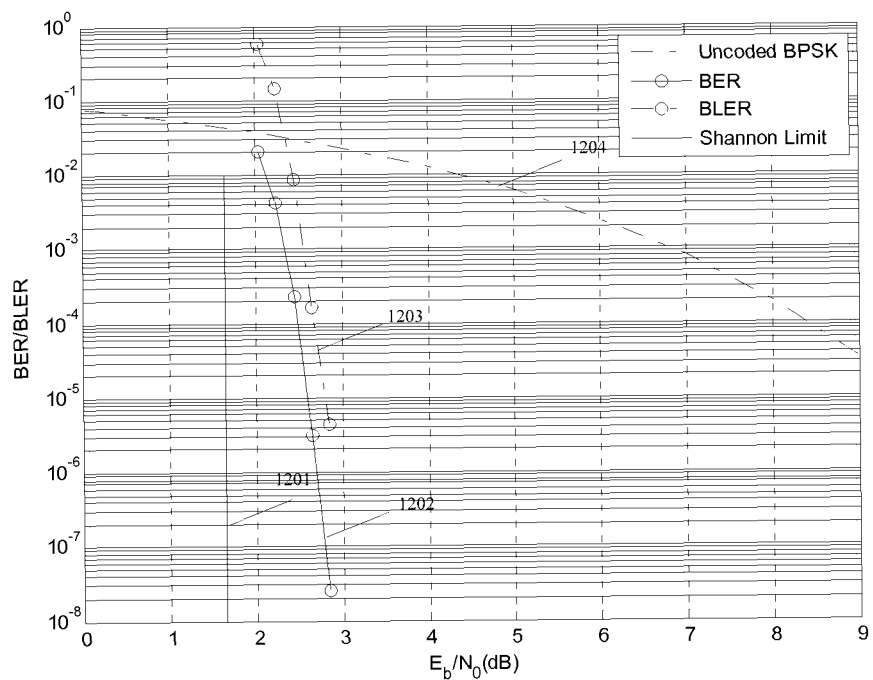
FIG. 12 illustrates the performance of (5376, 4032) LDPC code provided in the 11th embodiment in the present invention.

The following is the emulation comparison with the present technology, to show the performance of the (5376, 4032) irregular LDPC code provided in the 11th embodiment in the present invention. FIG. 12 is the illustration of the comparison of the BER/BLER performance of (5376,4032) LDPC code, with BPSK modulation, on AWGN channel in the 11th embodiment, and the performance of Shannon Limit, without encoding BPSK. In the emulation, the decoding takes sum-product algorithm, with maximum 50 iterative time.

Referred to FIG. 12, wherein, straight row 1201 represents the Shannon Limit;

Curve 1202 represents the BER of the signal, which is encoded with (5376,4032) irregular LDPC code in the present invention, modulated by BPSK, then transmitted through AWGN channel, and decoded with the algorithm of Sum-Product Arithmetic(SPA).

Curve 1203 represents the BLER of the signal, which is encoded with (5376,4032) irregular LDPC code in the present invention, modulated by BPSK, then transmitted through AWGN channel, and decoded with the algorithm of Sum-Product Arithmetic(SPA).

Curve 1204 represents the BER performance of the signal, which has not been encoded, modulated by BPSK, and transmitted through AWGN channel.

The 12th Embodiment

This embodiment takes (5376,4704) irregular LDPC code as an example. The code length N of the irregular LDPC code realized in this embodiment is 5376, the information bits length K is 4704, the row weight $\lambda=28$, the code rate $v=7/8$. It could be known from the relationship of the code rate, code length and the number of check equations that, the number of check equations M of the check matrix in this embodiment is M=5376−4074=672. In this embodiment, the submatrix, the dimension of which is 112×112, as the minimum unit, is took as the example to illustrate the realization process of LDPC code.

The flowchart of the method in this embodiment is similar to the flowchart of the illustrative method shown in FIG. 1, referred to FIG. 1, the realization method of the LDPC code comprises the following steps:

In step 101, generating the parity check matrix on the basis of the generating sequence corresponded to the preserved row generator.

The row generator of (5376,4704) LDPC code is illustrated in table 13, the (i+1) th row in the table is corresponded to the generating sequence of the (i+1) th row generator (0≤i<6).

TABLE 13

70 154 230 436 549 574 757 821 1002 1010 1141 1342 1352 1953
2226 2499 2745 2807 2993 3071 3308 3563 3869 4398 4549 4770
4891 5232
196 266 342 548 661 686 869 1122 1253 1464 1824 1963 2065 2338
2456 2611 2766 2857 3105 3183 3675 3801 3981 4096 4430 4510
4661 5003
184 308 378 454 660 773 798 981 1226 1753 1846 1936 2075 2450
2568 2878 2969 3217 3295 3382 3532 3609 3787 4093 4208 4542
4773 4882
208 296 420 490 566 772 885 910 1093 1157 1346 1477 1678 1688
1865 2187 2680 2990 3081 3494 4077 4320 4368 4654 4734 4994
5110 5352
30 155 320 408 532 602 678 884 1022 1269 1450 1458 1589 2160
2299 2792 3193 3255 3441 3756 3833 4011 4189 4317 4618 4885
4966 5106
62 158 267 432 520 644 714 790 996 1109 1317 1381 1570 1701
2089 2272 2411 2513 2617 3367 3631 3868 3945 4249 4301 5078
5218 5334

First, determining the number of rows and columns in said constructing parity check matrix on the basis of preset code length, code rate and the dimension of submatrix, and dividing said parity check matrixes into arrays in the unit of submatrix.

The parity check matrix, the code length of which is 5376, the code rate is ⅞, contains 6 row generators totally, each row generator is corresponded to one row osubmatrixes, each row has 48 submatrixes. Thus, the parity check matrix, the code length of which is 5376, the code rate is ⅞, contains 6×48 submatrixes, the dimension of which is 112×112.

Then determining the elements in the first row of each submatrix on the basis of the generating sequence corresponded to said row generator and the row weight.

Referred to table 13, each row in the table is the generating sequence corresponded to one row generator, each generating sequence corresponded to one row generator represents the number of column where element 1 locates in the first row of one row osubmatrixes (the range: 0~N−1, N=5376).

Because the row weight of the LDPC code in this embodiment is 28, 28 elements 1 locate in the first row of each row osubmatrixes, which is, 28 columns exists, the value of which is 1; furthermore, the submatrix in the parity check matrix in this embodiment is 112×112 matrix, and the number of check equations is 672, so, the row number ρ of the submatrix in the parity check matrix ρ=672/112=6, therefore, in this embodiment contain 168 digits, which is 6 rows×28 columns.

Table 13 contains several generating sequences comprising digits, the number of which is equal to the row weight. Taking the digits in each row of generating sequences in table 13 as the number of columns where element 1 locates in the first row of each corresponded row osubmatrixes. Which is, taking the digits in the first row of generating sequences in table 13 as the number of column where element 1 locates in the first row of the first row osubmatrixes, taking the digits in the second row of generating sequences in table 13 as the number of column where element 1 locates in the second row of the first row osubmatrixes, and so on, taking the digits in the final row of generating sequences in table 13 as the number of column where element 1 locates in the first row of the final row osubmatrixes.

Specifically, evenly dividing table 13 into several generating sequences containing 28 digits, obtaining the elements in the first row of each row osubmatrixes in the parity check matrix on the basis of the obtained digits in each row of generating sequences, which is, the digits in each row illustrated in table 13.

For example, as shown in table 13, the first row of generating sequence is 55, 85, 167, 198, 212, 274, 334, 368, 384, 429, 486, 512, 550, 617, 666, 689, 752, 779, 874, 885, 940, 973, 1047, 1064, 1103, 1149, 1253 and 1265, which means the first row of the first row osubmatrixes in the parity check matrix, which is the value of the 56th, 86th, 168th, 199th, 213th, 275th, 335th, 369th, 385th, 430th, 487th, 513th, 551th, 618th, 667th, 690th, 753th, 780th, 875th, 886th, 941th, 974th, 1048th, 1065th, 1104th, 1150th, 1254th and 1266th column in the first row in the parity check matrix is 1, other columns in the first row osubmatrixes are all 0;

Evenly dividing each row osubmatrixes, the value of the first row of which is determined, to c submatrixes in column; here, because the submatrix of the parity check matrix in this embodiment is 112×112 matrix, and the code length is 5376, each row has c=5376/112=48 submatrixes; after dividing, the parity check matrix is divided to 6(row)×28(column)=168 submatrixes, and the value of elements in the first row of each submatrix is determined.

Finally, obtaining the elements in the other rows of the submatrix, on the basis of the elements in the first row of each submatrix, by cyclic shift or directly addressing.

The detailed realization process is the same as step 101, which is not described hereinafter.

After the above steps, the parity check matrix H could be obtained. Because 6(row)×28(column)=168 digits exist in the generating sequence in table 1 in this embodiment. 168 substitution unit matrixes exist in the parity check matrix in this embodiment.

In this step, after obtaining the parity check matrix, carrying out the transforming such as rotating by any angle, row substitution, column substitution or position changing of submatrix.

In step 102, encoding said input data by the generating matrix G obtained from parity check matrix H, and transforming to LDPC codewords, obtaining the output data containing the parity check information.

Above is the illustrative process of the method for data transmission in the 12th embodiment in the present invention.

It could be got from the above embodiments that, the present invention uses the generating sequence corresponded to the row generator to represent the parity check matrix, and obtains the parity check matrix by cyclic shift or directly addressing of the row generator, and makes the parity check matrix take the minimum storage space.

Figure 13:
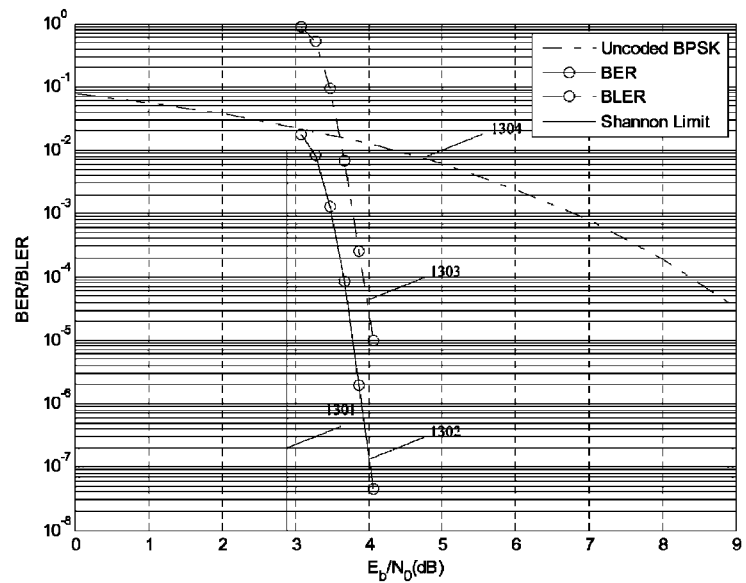
FIG. 13 illustrates the performance of (5376, 4704) LDPC code provided in the 12th embodiment in the present invention.

The following is the emulation comparison with the present technology, to show the performance of the (5376, 4704) irregular LDPC code provided in the 12th embodiment in the present invention. FIG. 13 is the illustration of the comparison of the BER/BLER performance of (5376,4704) LDPC code, with BPSK modulation, on AWGN channel in the 12th embodiment, and the performance of Shannon Limit, without encoding BPSK. In the emulation, the decoding takes sum-product algorithm, with maximum 50 iterative time.

Referred to FIG. 13, wherein, straight row 1301 represents the Shannon Limit;

Curve 1302 represents the BER of the signal, which is encoded with (5376,4704) irregular LDPC code in the present invention, modulated by BPSK, then transmitted through AWGN channel, and decoded with the algorithm of Sum-Product Arithmetic(SPA).

Curve 1303 represents the BLER of the signal, which is encoded with (5376,4704) irregular LDPC code in the present invention, modulated by BPSK, then transmitted through AWGN channel, and decoded with the algorithm of Sum-Product Arithmetic(SPA).

Curve 1304 represents the BER performance of the signal, which has not been encoded, modulated by BPSK, and transmitted through AWGN channel.

The 13$^{th}$ Embodiment

Figure 14:
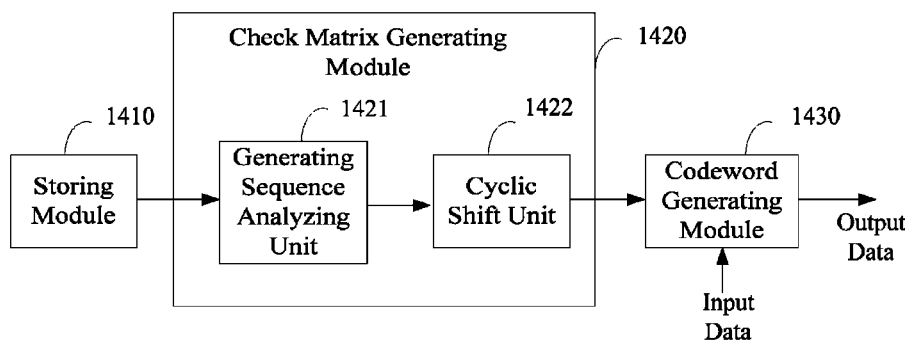
FIG. 14 illustrates the structure of the apparatus for data transmission provided in the 13th embodiment in the present invention.

FIG. 14 illustrates the structure of the apparatus for data transmission in the 13th embodiment in the present invention. Referred to FIG. 14, said apparatus comprises: the storing module 1410, the check matrix generating module 1420 and the codeword generating module 1430, wherein, the check matrix generating module 1420 further comprises: the generating sequence analyzing unit 1421 and the cyclic shift unit 1422.

In the apparatus illustrated in FIG. 14,

The storing module 1410, used for storing the generating sequence and providing said stored generating sequence to the generating sequence analyzing unit 1421 in check matrix generating module 1420;

the generating sequence analyzing unit 1421 in the check matrix generating module 1420, used for determining the rownumber of rows and columns in the said constructing parity check matrix, on the basis of the preset code length, code rate and the dimension of submatrixes, and dividing said parity check matrix into arrays in the unit of submatrix: determining the elements in the first row of each submatrix on the basis of the generating sequence corresponded to said row generator and the row weight; determining the elements in other rows of each submatrix on the basis of the elements in the first row of said each submatrix, transmitting each row osubmatrixes, the elements in the first row of which have been determined, to said cyclic shift unit 1422;

the cyclic shift unit 1422 in the check matrix generating module 1420, used for obtaining each submatrix by cyclic shift, on the basis of the elements in the first row of each submatrix, here, the submatrixes construct the parity check matrix in this embodiment, which is transmitted to codeword generating module 1430;

the codeword generating module 1430, used for receiving said parity check matrix from the cyclical shifting unit 1422 in said check matrix generating module 1420, and encoding the input data by the generated matrix obtained by said parity check matrix.

The apparatus illustrated in FIG. 14, could further comprises: check matrix transforming unit, said check matrix transforming unit, used for transforming the parity check matrix obtained from cyclic shift unit 1422 by rotating, row substitution, column substitution, or changing the position of submatrixes, and transmitting the transformed parity check matrix to codeword generating module 1430.

Said check matrix transforming module could be set separately in the realizing apparatus in the embodiment, in the check matrix generating module 1420, or in other module.

It could be known from the above embodiment, the present invention uses the generating sequence corresponded to row generator to represent the parity check matrix, and obtains the parity check matrix by cyclical shifting of the generating sequence, makes the parity check matrix take the minimum storage space.

The 14$^{th}$ Embodiment

Figure 15:
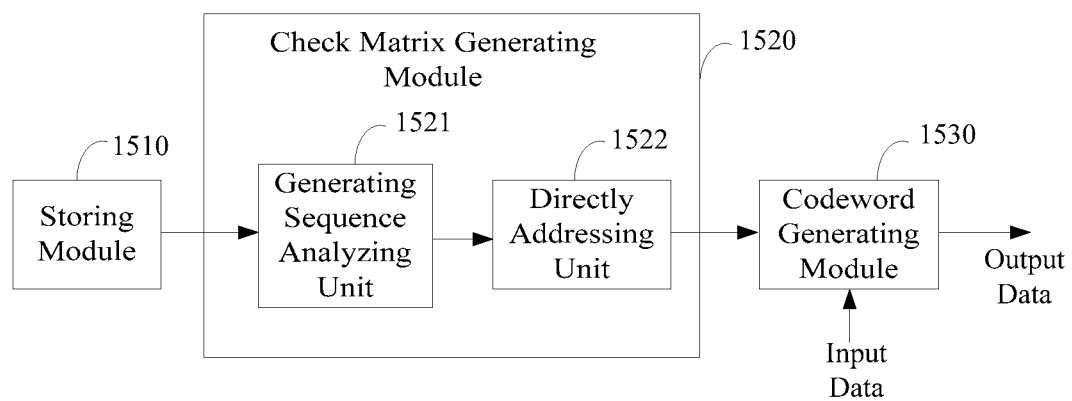
FIG. 15 illustrates the structure of another apparatus for data transmission provided in the 14th embodiment in the present invention.

FIG. 15 illustrates the structure of the apparatus for data transmission in the 13th embodiment in the present invention. Referred to FIG. 15, said apparatus comprises: the storing module 1510, the check matrix generating module 1520 and the codeword generating module 1530, wherein, the check matrix generating module 1520 further comprises: the generating sequence analyzing unit 1521 and the directly addressing unit 1522.

In the apparatus illustrated in FIG. 15, the storing module 1510, used for storing the generating sequence and providing said stored generating sequence to the generating sequence analyzing unit 1521 in check matrix generating module 1520;

the generating sequence analyzing unit 1521 in the check matrix generating module 1520, used for determining the rownumber of rows and columns in the said constructing parity check matrix, on the basis of the preset code length, code rate and the dimension of submatrixes, and dividing said parity check matrix into arrays in the unit of submatrix: determining the elements in the first row of each submatrix on the basis of the generating sequence corresponded to said row generator and the row weight; determining the elements in other rows of each submatrix on the basis of the elements in the first row of said each submatrix, transmitting each row osubmatrixes, the elements in the first row of which have been determined, to said directly addressing unit 1522;

the directly addressing unit 1522 in the check matrix generating module 1520, used for obtaining each submatrix by directly addressing, on the basis of the elements in the first row of each submatrix, here, the submatrixes construct the parity check matrix in this embodiment, which is transmitted to codeword generating module 1530;

The codeword generating module 1530, used for receiving said parity check matrix from the directly addressing unit 1522 in said check matrix generating module 1520, and transforming the input data to LDPC code by said parity check matrix.

the apparatus illustrated in FIG. 15, could further comprises: check matrix transforming unit, said check matrix transforming unit, used for transforming the parity check matrix obtained from directly addressing unit 1522 by rotating, row substitution, column substitution, or changing the position of submatrixes, and transmitting the transformed parity check matrix to codeword generating module 1530.

Said check matrix transforming module could be set separately in the realizing apparatus in the embodiment, in the check matrix generating module 1520, or in other module.

The apparatus for data transmission provided in the 13th and 14th embodiments, the principle and the related process is similar to the above method for data transmission, which is not described hereinafter.

It could be known from the above embodiment, the present invention uses the generating sequence corresponded to row generator to represent the parity check matrix, and obtains the parity check matrix by directly addressing of the generating sequence, makes the parity check matrix take the minimum storage space.

It should be understood that the specific order or hierarchy of the steps in the process disclosed is only an example of the exemplary methods. The specific order or hierarchy of the steps in the process may be re-arranged based on design preference, without departing from the protection scope of the invention. The method claims appended give various step factors in an exemplary order, rather than being limited to the specific order or hierarchy.

In the above detailed description, to simplify the invention, various features are combined in a single implementation solution. This disclosing method should not be interpreted as reflecting such an intention; that is, the implementation solutions of the subject to be protected require more features than those stated clearly in each claim. On the contrary, as reflected in the appended claims, the invention is in a state in which it has less features than the whole features of a single implementation solution that is disclosed. Therefore, the claims appended are hereby incorporated in the detailed description clearly, wherein each claim independently acts as an individual preferred implementation solution of the invention.

The above description includes the examples of one or more embodiments. However, it is impossible to combine all the possibilities of the components and methods that are used to describe the above embodiments, but it should be recognized by one skilled in the art that each embodiment may be further combined and arranged. Therefore, the embodiments described herein intend to contemplate all such changes, modifications and variations that fall into the protection scope of the appended claims. In addition, for the term "comprise" used in the specification or the claims, it is similar to the term "include", just like the interpretation of "include" in the claims as a connection word. In addition, any term "or" used in the claims or the specification intends to represent a "non-exclusive or".

What is claimed is:

1. A method for data transmission, comprising:
generating a parity check matrix on a basis of a generating sequence corresponding to a preserved row generator; and
encoding input data by the generated matrix obtained by the parity check matrix, and obtaining output data comprising parity check information,
wherein the generating the parity check matrix comprising:
determining a number of rows and columns in the parity check matrix on a basis of preset code length, code rate and a dimension of submatrix, and dividing the parity check matrix into arrays in a unit of submatrix;
determining elements in a first row of each submatrix on a basis of the generating sequence corresponded to the row generator and a row weight; and
obtaining the elements in the other rows of each submatrix, on the basis of the elements in the first row of each submatrix.

2. The method of claim 1, further comprising obtaining the elements in the other rows of each submatrix by cyclic shift on the basis of the elements in the first row of each submatrix.

3. The method of claim 1, further comprising obtaining the elements in the other rows of each submatrix by directly addressing, on the basis of the elements in the first row of each submatrix, wherein the directly addressing specifically comprises:
taking a jth element $x_{i,j-1}^{(1)}$ in a i+1th generating sequence $x_i^{(1)}$, to generate a submatrix $A_{i,n}$ in the i+1th row, n+1th column,
wherein, in a first row $[a_{0,0}, a_{0,1}, L, a_{0,t-1}] = [a_0, a_1, L, a_{t-1}]$ of the submatrix $A_{i,n} = [a_{l,m}], 0 \leq l < t$; $0 \leq m < t$, only the $mod(x_{i,j-1}^{(1)}, t)+1$th element is 1, the other t−1 elements are all 0;
generating a whole matrix $A_{i,n}$ on the basis of the first row $[a_0, a_1, L, a_{t-1}]$, the process comprising $a_{l,m} = a_{mod(m-l,t)}$, $0 \leq l < t$; $0 \leq m < t$;
each non-zero element in the generating sequence corresponds to one non-zero matrix, other submatrixes are all zero matrixes, the dimension of which is t×t;
wherein, the generating sequence $x_i^{(1)} = [x_{i,0}^{(1)}, x_{i,1}^{(1)}, L, x_{i,j-1}^{(1)}], 0 \leq i < \rho$;
$n = floor(x_{i,j-1}^{(1)}/t)$;
$\rho$ represents a number of sub row generators;
i represents a number of the row generating sequence;
j represents an element number of the row generating sequence;
$l_i$ represents a number of elements in the ith row generating sequence;
t represents the dimension.

4. The method of claim 3, wherein when the code length is 1344, the code rate is ½, the row weight is 7, the row generator is denoted by the generating sequence as follows:
  1st Row: 156, 326, 342, 444, 575, 898, 1005;
  2nd Row: 55, 85, 167, 486, 617, 1047, 1307;
  3rd Row: 410, 821, 873, 927, 982, 1106, 1191;
  4th Row: 10, 61, 139, 251, 468, 773, 915;
  5th Row: 52, 103, 324, 400, 612, 743, 792;
  6th Row: 26, 70, 145, 195, 502, 718, 1108;
  7th Row: 31, 68, 112, 187, 544, 578, 1313;
  8th Row: 73, 110, 229, 307, 337, 681, 1192;
  9th Row: 18, 196, 271, 379, 806, 1168, 1267;
  10th Row: 60, 121, 262, 391, 421, 548, 1088;
  11th Row: 25, 163, 355, 433, 652, 712, 1067;
  12th Row: 96, 144, 505, 618, 632, 1172, 1251;
  13th Row: 5, 109, 138, 186, 320, 517, 846;
  14th Row: 35, 47, 151, 228, 671, 716, 1256;
  15th Row: 0, 89, 270, 367, 713, 1032, 1298;
  16th Row: 20, 42, 119, 131, 235, 264, 956;
  wherein, the (i+1) th row corresponds to the generating sequence of the (i+1) th row generator (0≤i<16);
  there are 16 row submatrixes, each having 32 submatrixes;
  the submatrix is the square matrix, a dimension of which is 42×42; and
  the parity check matrix comprises 112 substitution unit matrixes.

5. The method of claim 3, wherein when the code length is 1344, the code rate is ⅝, the row weight is 10, the row generator is denoted by the generating sequence as follows:
  1st Row: 265, 295, 377, 408, 422, 544, 578, 696, 722, 1176;
  2nd Row: 122, 201, 244, 279, 307, 337, 450, 464, 885, 1295;
  3rd Row: 164, 243, 321, 349, 379, 461, 492, 916, 927, 1015;
  4th Row: 120, 262, 363, 391, 421, 503, 548, 720, 765, 958;
  5th Row: 8, 185, 280, 304, 355, 576, 712, 762, 1190, 1229;
  6th Row: 24, 50, 204, 278, 322, 447, 618, 804, 1042, 1108;
  7th Row: 66, 283, 320, 364, 388, 439, 660, 899, 1257, 1313;
  8th Row: 134, 289, 325, 406, 430, 531, 838, 1004, 1137, 1316;
  9th Row: 150, 214, 367, 404, 448, 523, 601, 880, 983, 1073;
  10th Row: 40, 90, 264, 409, 615, 643, 786, 862, 1088, 1276;
  11th Row: 277, 306, 354, 415, 532, 607, 657, 685, 828, 1130;
  12th Row: 64, 319, 348, 396, 457, 493, 574, 727, 870, 1172;
  wherein, the (i+1) th row corresponds to the generating sequence of the (i+1) th row generator (0≤i<12);
  there are 12 row submatrixes, each having 32 submatrixes;
  the submatrix is the square matrix, the dimension of which is 42×42; and
  the parity check matrix comprises 120 substitution unit matrixes.

6. The method one of claim 3, wherein when the code length is 1344, the code rate is ¾, the row weight is 15, the row generator is denoted by the generating sequence as follows:
  1st Row: 3, 91, 140, 223, 253, 335, 366, 502, 536, 680, 718, 785, 1089, 1103, 1253;
  2nd Row: 34, 165, 237, 265, 295, 377, 408, 422, 544, 594, 899, 989, 1106, 1295, 1307;
  3rd Row: 76, 87, 279, 337, 419, 450, 464, 586, 681, 764, 918, 1004, 1031, 1066, 1145;
  4th Row: 207, 220, 271, 321, 379, 568, 628, 662, 806, 960, 1053, 1099, 1148, 1187, 1302;
  5th Row: 238, 262, 313, 363, 391, 503, 534, 548, 720, 765, 822, 848, 953, 1025, 1173;
  6th Row: 80, 236, 280, 304, 355, 405, 433, 463, 576, 590, 652, 890, 928, 1044, 1232;
  7th Row: 36, 159, 171, 241, 278, 322, 346, 397, 447, 475, 505, 632, 754, 849, 1274;
  8th Row: 78, 101, 202, 247, 320, 364, 388, 439, 517, 547, 674, 830, 846, 974, 1192;
  wherein, the (i+1) th row corresponds to the generating sequence of the (i+1) th row generator (0≤i<8);
  there are 8 row submatrixes, each having 32 submatrixes;
  the submatrix is a square matrix, the dimension of which is 42×42; and
  the parity check matrix comprises 120 substitution unit matrixes.

7. The method of claim 3, wherein when the code length is 1344, the code rate is ⅞, the row weight is 28, the row generator is denoted by the generating sequence as follows:
  1st Row: 55, 85, 167, 198, 212, 274, 334, 368, 384, 429, 486, 512, 550, 617, 666, 689, 752, 779, 874, 885, 940, 973, 1047, 1064, 1103, 1149, 1253, 1265;
  2nd Row: 20, 69, 97, 127, 209, 240, 254, 316, 376, 410, 426, 471, 528, 554, 592, 659, 708, 731, 794, 821, 873, 927, 982, 1015, 1089, 1145, 1191, 1307;
  3rd Row: 15, 61, 111, 139, 169, 251, 282, 296, 358, 418, 452, 468, 513, 570, 596, 634, 701, 750, 773, 836, 863, 915, 969, 1131, 1148, 1187, 1238, 1260;
  4th Row: 11, 52, 103, 153, 181, 211, 293, 324, 338, 400, 460, 494, 510, 555, 612, 638, 676, 743, 792, 815, 905, 957, 1011, 1066, 1099, 1190, 1233, 1302;
  wherein, the (i+1) th row corresponds to the generating sequence of the (i+1) th row generator (0≤i<4);
  there are 4 row submatrixes, each having 32 submatrixes;
  the submatrix is a square matrix, the dimension of which is 42×42; and
  the parity check matrix comprises 112 substitution unit matrixes.

8. The method of claim 3, wherein when the code length is 2688, the code rate is ½, the row weight is 7, the row generator is denoted by the generating sequence as follows:
  1st Row: 417, 582, 1113, 1518, 2328, 2388, 2544;
  2nd Row: 112, 343, 529, 607, 844, 1405, 1861;
  3rd Row: 61, 176, 302, 393, 455, 641, 2054;
  4th Row: 259, 414, 505, 753, 918, 1706, 2166;
  5th Row: 248, 371, 526, 943, 1030, 1257, 1680;
  6th Row: 91, 328, 483, 729, 1292, 1792, 2390;
  7th Row: 440, 595, 841, 1561, 1613, 1904, 2502;
  8th Row: 265, 434, 552, 707, 1279, 1547, 2302;
  9th Row: 22, 273, 377, 546, 1127, 1659, 2645;
  10th Row: 134, 283, 489, 808, 931, 1949, 2077;
  11th Row: 256, 497, 770, 888, 920, 1198, 1351;
  12th Row: 278, 368, 1032, 1155, 1401, 2173, 2602;
  there are 12 row submatrixes, each having 24 submatrixes;
  the submatrix is the square matrix, the dimension of which is 112×112; and
  the parity check matrix comprises 84 substitution unit matrixes.

9. The method of claim 3, wherein when the code length is 2688, the code rate is ⅝, the row weight is 10, the row generator is denoted by the generating sequence as follows:
  1st Row: 7, 193, 271, 358, 508, 941, 1069, 1232, 1830, 2544;
  2nd Row: 57, 119, 305, 383, 470, 875, 1482, 1630, 1710, 1861;

3rd Row: 78, 169, 231, 417, 582, 732, 987, 1456, 1594, 2427;
4th Row: 35, 190, 281, 343, 529, 607, 1099, 1405, 1520, 2085;
5th Row: 24, 147, 302, 393, 641, 806, 1211, 1680, 2197, 2278;
6th Row: 104, 136, 259, 414, 1145, 1323, 1449, 1744, 2309, 2646;
7th Row: 98, 216, 248, 371, 526, 943, 1257, 1904, 2190, 2502;
8th Row: 41, 210, 328, 360, 729, 1055, 1142, 1673, 2382, 2614;
9th Row: 49, 153, 322, 440, 595, 750, 841, 1404, 1965, 2080;
wherein, the (i+1) th row corresponds to the generating sequence of the (i+1) th row generator (0≤i<9);
there are 9 row submatrixes, each having 24 submatrixes;
the submatrix is the square matrix, the dimension of which is 112×112; and
the parity check matrix comprises 90 substitution unit matrixes.

10. The method of claim 3, wherein when the code length is 2688, the code rate is ¾, the row weight is 15, the row generator is denoted by the generating sequence as follows:
    1st Row: 62, 293, 374, 514, 679, 865, 943, 1030, 1180, 1257, 1435, 1613, 1904, 2203, 2388;
    2nd Row: 26, 626, 729, 791, 977, 1055, 1142, 1292, 1369, 1547, 1725, 1853, 1968, 2016, 2500;
    3rd Row: 138, 598, 750, 841, 903, 1089, 1167, 1404, 1659, 1785, 1837, 1965, 2080, 2310, 2552;
    4th Row: 112, 398, 707, 862, 953, 1015, 1201, 1279, 1366, 1516, 1593, 1897, 1949, 2306, 2664;
    5th Row: 61, 176, 224, 362, 510, 590, 696, 819, 974, 1065, 1127, 1478, 1628, 1705, 2197;
    6th Row: 288, 474, 776, 808, 931, 1086, 1177, 1239, 1503, 1740, 1817, 2121, 2158, 2390, 2646;
    wherein, the (i+1) th row corresponds to the generating sequence of the (i+1) th row generator (0≤i<6);
    there are 6 row submatrixes, each has 24 submatrixes;
    the submatrix is a square matrix, the dimension of which is 112×112; and
    the parity check matrix comprises 90 substitution unit matrixes.

11. The method of claim 3, wherein when the code length is 2688, the code rate is ⅞, the row weight is 21, the row generator is denoted by the generating sequence as follows:
    1st Row: 7, 193, 271, 358, 508, 585, 763, 889, 941, 1069, 1184, 1232, 1370, 1518, 1598, 1749, 1830, 1970, 2086, 2203, 2544;
    2nd Row: 57, 119, 305, 383, 470, 620, 697, 875, 1001, 1053, 1181, 1296, 1344, 1482, 1630, 1861, 1942, 2198, 2315, 2440, 2500;
    3rd Row: 78, 169, 231, 417, 495, 582, 732, 809, 987, 1113, 1165, 1293, 1408, 1456, 1594, 1742, 1822, 2054, 2194, 2310, 2612;
    4th Row: 35, 190, 281, 343, 529, 607, 694, 844, 921, 1099, 1225, 1277, 1405, 1520, 1568, 1706, 1934, 2085, 2306, 2422, 2664;
    there are 4 row submatrixes, each having 24 submatrixes;
    the submatrix is a square matrix, the dimension of which is 112×112; and
    the parity check matrix comprises 84 substitution unit matrixes.

12. The method of claim 3, wherein when the code length is 5376, the code rate is ½, the row weight is 7, the row generator is denoted by the generating sequence as follows:
    1st Row: 147, 281, 1109, 1381, 2089, 4658, 5232;
    2nd Row: 98, 607, 826, 1108, 1813, 2024, 4398;
    3rd Row: 1220, 1333, 1605, 2406, 3031, 4661, 4998;
    4th Row: 248, 526, 1445, 1906, 2238, 2248, 4854;
    5th Row: 880, 968, 1092, 1162, 1557, 2149, 3494;
    6th Row: 322, 718, 827, 992, 1080, 1274, 4317;
    7th Row: 434, 1316, 1668, 3048, 3214, 3305, 5109;
    8th Row: 377, 765, 815, 1216, 2354, 3417, 3743;
    9th Row: 1163, 1610, 1686, 1892, 2005, 2466, 3591;
    10th Row: 658, 1039, 1166, 1275, 2117, 2808, 3967;
    11th Row: 1101, 1151, 2501, 2682, 2985, 4079, 4571;
    12th Row: 796, 1019, 1213, 2341, 2613, 3083, 3865;
    13th Row: 502, 706, 908, 1325, 1776, 2802, 4795;
    14th Row: 37, 818, 991, 1020, 1487, 2933, 5213;
    15th Row: 614, 930, 1300, 1835, 3682, 4764, 5325;
    16th Row: 357, 558, 946, 1244, 2394, 2676, 4953;
    17th Row: 751, 886, 1356, 1773, 1823, 2059, 2949;
    18th Row: 100, 764, 1468, 2336, 3321, 4168, 4537;
    19th Row: 213, 876, 975, 1378, 1580, 2730, 3433;
    20th Row: 688, 835, 988, 1692, 2159, 2560, 2772;
    21st Row: 783, 1199, 1334, 2760, 3750, 4081, 4472;
    22nd Row: 912, 1311, 1504, 1916, 2884, 3952, 4193;
    23rd Row: 699, 1024, 1171, 1999, 2196, 5097, 5345;
    24th Row: 184, 771, 3221, 3474, 3816, 4315, 4840;
    wherein, the (i+1) th row corresponds to the generating sequence of the (i+1) th row generator (0≤i<24);
    there are 24 row submatrixes, each having 48 submatrixes;
    the submatrix is a square matrix, the dimension of which is 112×112; and
    the parity check matrix comprises 168 substitution unit matrixes.

13. The method of claim 3, wherein when the code length is 5376, the code rate is ⅝, the row weight is 10, the row generator is denoted by the generating sequence as follows:
    1st Row: 60, 773, 981, 1045, 1226, 1234, 1576, 1846, 2969, 4437;
    2nd Row: 22, 566, 772, 1093, 2048, 2289, 3329, 3984, 4318, 5344;
    3rd Row: 315, 408, 532, 678, 1977, 2070, 2505, 2792, 3494, 4742;
    4th Row: 432, 520, 714, 790, 996, 1570, 2936, 3214, 3305, 3367;
    5th Row: 826, 1221, 1429, 1493, 1674, 2024, 2201, 3016, 4654, 5222;
    6th Row: 382, 491, 744, 868, 938, 1786, 2313, 4137, 4189, 4997;
    7th Row: 119, 367, 603, 1126, 1445, 1470, 2238, 2747, 3395, 4301;
    8th Row: 479, 715, 968, 1444, 1557, 1765, 2350, 3234, 3830, 4413;
    9th Row: 347, 1080, 1204, 1877, 1941, 2130, 2472, 2832, 4653, 4816;
    10th Row: 459, 653, 703, 830, 939, 1462, 3662, 3703, 4585, 4765;
    11th Row: 302, 571, 942, 1216, 1428, 1918, 3056, 3195, 3815, 5040;
    12th Row: 431, 628, 877, 1054, 1163, 1328, 1686, 2458, 3307, 5290;
    13th Row: 210, 370, 543, 572, 740, 1039, 1166, 2389, 2570, 4973;
    14th Row: 153, 386, 655, 907, 1101, 2682, 2821, 3998, 4907, 5085;
    15th Row: 498, 796, 1213, 1263, 1664, 2613, 3531, 3625, 4110, 4527;
    16th Row: 438, 879, 908, 1076, 1864, 2453, 2661, 3045, 4222, 5257;
    17th Row: 550, 608, 818, 1020, 1188, 1243, 2773, 2837, 3368, 3526;

18th Row: 8, 527, 662, 720, 834, 930, 1103, 3130, 3616, 3745;

wherein, the (i+1) th row corresponds to the generating sequence of the (i+1) th row generator (0≤i<18);

there are 18 row submatrixes, each having 48 submatrixes;

the submatrix is a square matrix, the dimension of which is 112×112; and the parity check matrix comprises 180 substitution unit matrixes.

14. The method of claim 3, wherein when the code length is 5376, the code rate is ¾, the row weight is 15, the row generator is denoted by the generating sequence as follows:

1st Row: 0, 181, 342, 661, 686, 869, 933, 1963, 2919, 3105, 3183, 3270, 4398, 4518, 5076;

2nd Row: 64, 308, 378, 660, 773, 1365, 2177, 2450, 2568, 2723, 2878, 3532, 4144, 4770, 5344;

3rd Row: 296, 490, 566, 772, 885, 1477, 1678, 1688, 2562, 2680, 3721, 4077, 4256, 4661, 5240;

4th Row: 320, 532, 602, 884, 997, 1022, 1450, 1458, 1589, 1790, 1800, 3193, 4011, 4205, 4854;

5th Row: 267, 432, 644, 714, 790, 1134, 1317, 1381, 1562, 1902, 2089, 3367, 3868, 4506, 4966;

6th Row: 379, 544, 632, 826, 902, 1246, 1674, 1682, 2014, 2294, 2729, 2898, 3016, 3048, 4846;

7th Row: 382, 491, 656, 744, 868, 1014, 2126, 2136, 2313, 2406, 2496, 3438, 3942, 4361, 4730;

8th Row: 60, 157, 317, 367, 494, 768, 856, 1050, 1126, 1906, 2608, 3641, 3889, 4054, 4990;

9th Row: 235, 429, 479, 606, 715, 1162, 1238, 1444, 1557, 1582, 1765, 3352, 3507, 3662, 5102;

10th Row: 292, 347, 541, 827, 1080, 1204, 1274, 2742, 2832, 3464, 3774, 3927, 4316, 5214, 5294;

11th Row: 236, 459, 703, 939, 1806, 2053, 2234, 2242, 3083, 3185, 3576, 3608, 3886, 4428, 4697;

12th Row: 319, 348, 516, 571, 765, 815, 1893, 1918, 2354, 2686, 2966, 3297, 3720, 4089, 4225;

wherein, the (i+1) th row corresponds to the generating sequence of the (i+1) th row generator (0≤i<12);

there are 12 row submatrixes, each having 48 submatrixes;

the submatrix is the square matrix, the dimension of which is 112×112; and the parity check matrix comprises 180 substitution unit matrixes.

15. The method of claim 3, wherein when the code length is 5376, the code rate is ⅞, the row weight is 28, the row generator is denoted by the generating sequence as follows:

1st Row: 70, 154, 230, 436, 549, 574, 757, 821, 1002, 1010, 1141, 1342, 1352, 1953, 2226, 2499, 2745, 2807, 2993, 3071, 3308, 3563, 3869, 4398, 4549, 4770, 4891, 5232;

2nd Row: 196, 266, 342, 548, 661, 686, 869, 1122, 1253, 1464, 1824, 1963, 2065, 2338, 2456, 2611, 2766, 2857, 3105, 3183, 3675, 3801, 3981, 4096, 4430, 4510, 4661, 5003;

3rd Row: 184, 308, 378, 454, 660, 773, 798, 981, 1226, 1753, 1846, 1936, 2075, 2450, 2568, 2878, 2969, 3217, 3295, 3382, 3532, 3609, 3787, 4093, 4208, 4542, 4773, 4882;

4th Row: 208, 296, 420, 490, 566, 772, 885, 910, 1093, 1157, 1346, 1477, 1678, 1688, 1865, 2187, 2680, 2990, 3081, 3494, 4077, 4320, 4368, 4654, 4734, 4994, 5110, 5352;

5th Row: 30, 155, 320, 408, 532, 602, 678, 884, 1022, 1269, 1450, 1458, 1589, 2160, 2299, 2792, 3193, 3255, 3441, 3756, 3833, 4011, 4189, 4317, 4618, 4885, 4966, 5106;

6th Row: 62, 158, 267, 432, 520, 644, 714, 790, 996, 1109, 1317, 1381, 1570, 1701, 2089, 2272, 2411, 2513, 2617, 3367, 3631, 3868, 3945, 4249, 4301, 5078, 5218, 5334;

wherein, the (i+1)th row corresponds to the generating sequence of the (i+1)th row generator (0≤i<6);

there are 6 row submatrixes, each having 48 submatrixes;

the submatrix is a square matrix, the dimension of which is 112×112;

the parity check matrix comprises 168 substitution unit matrixes.

16. An apparatus for data transmission, comprising:

a storing module;

a check matrix generating module; and a codeword generating module; wherein the storing module is used for storing a generating sequence corresponding to a row generator and providing the generating sequence to the check matrix generating module;

the check matrix generating module is used for generating a parity check matrix on a basis of the generating sequence provided by the storing module, and transmitting the parity check matrix to the codeword generating module; and the codeword generating module is used for receiving the parity check matrix from the check matrix generating module, and encoding the input data by the generated matrix obtained by the parity check matrix, wherein the check matrix generating module includes a generating sequence analyzing unit that determines a number of rows and columns in the parity check matrix on a basis of a preset code length, code rate and a dimension of submatrixes, and divides the parity check matrix into arrays in a unit of submatrix; determines the elements in a first row of each submatrix on a basis of the generating sequence corresponding to the row generator and the row weight; and obtains the elements in other rows of each submatrix, on the basis of the elements in the first row of the each submatrix.

17. The apparatus of claim 16, wherein the check matrix generating module further comprises:

a cyclic shift unit; wherein the storing module provides the generating sequence to the generating sequence analyzing unit;

the generating sequence analyzing unit transmits each row submatrix, the elements in the first row of which have been determined, to the cyclic shift unit; and the cyclic shift unit, obtains each submatrix by cyclic shift, on the basis of the elements in the first row of each submatrix, wherein the submatrixes construct the parity check matrix, which is transmitted to the codeword generating module.

18. The apparatus of claim 16, wherein the check matrix generating module further comprises:

a directly addressing unit; wherein the storing module provides the stored generating sequence to the generating sequence analyzing unit;

the generating sequence analyzing unit transmits each row submatrix, the elements in the first row of which have been determined, to the directly addressing unit; and the directly addressing unit obtains each submatrix by directly addressing, on the basis of the elements in the first row of each submatrix, the submatrixes construct the parity check matrix, which is transmitted to the codeword generating module.

19. The apparatus of claim 18, wherein direct addressing mode used by the directly addressing unit in detail comprises:

taking a jth element $x_{i,j-1}^{(1)}$ in a i+1th generating sequence $x_i^{(1)}$, to generate a submatrix $A_{i,n}$ in the i+1th row, n+1th column, wherein, in a first row $[a_{0,0},a_{0,1},L,a_{0,t-1}]=[a_0,a_1,L,a_{t-1}]$ of a submatrix $A_{i,n}=[a_{l,m}], 0 \leq l < t; 0 \leq m < t$, only a $\mod(x_{i,j-1}^{(1)}, t)+1$th element is 1, other t−1 elements are all 0; wherein generating the whole matrix $A_{i,n}$ on the basis of the first row $[a_0,a_1,L,a_{t-1}]$, comprises: $a_{l,m}=a_{mod(m-l,t)}, 0 \leq l < t; 0 \leq m < t$;

each non-zero element in the generating sequence corresponds to one non-zero matrix, other submatrixes are all zero matrixes, a dimension of which is t×t;

wherein, a generating sequence $x_i^{(1)}=[x_{i,0}(1),x_{i,1}^{(1)},L,x_{i,l_i-1}^{(1)}], 0 \leq i < \rho$;

n=floor($x_{i,j-1}^{(1)}/t$);

ρ represents a number of sub row generators;

i represents a number of the row generating sequence;

j represents an element number of the row generating sequence;

$l_i$ represents a number of elements in the ith row generating sequence;

t represents the dimension.

\* \* \* \* \*